(12) United States Patent
Sato

(10) Patent No.: US 6,335,269 B1
(45) Date of Patent: Jan. 1, 2002

(54) SEMICONDUCTOR SUBSTRATE AND METHOD FOR PRODUCING THE SAME

(75) Inventor: Nobuhiko Sato, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/390,296

(22) Filed: Sep. 3, 1999

(30) Foreign Application Priority Data

Sep. 4, 1998 (JP) ............................................ 10-251271

(51) Int. Cl.$^7$ .............................................. H01L 21/20
(52) U.S. Cl. ...................................................... 438/509
(58) Field of Search ........................... 438/16, 406, 409, 438/455, 458, 459, 466, 478, 479, 509, 735, 960, 977, 737, 738; 148/33.4, 33.5

(56) References Cited

U.S. PATENT DOCUMENTS

| | | | |
|---|---|---|---|
| 5,371,037 A | 12/1994 | Yonehara ...................... | 437/86 |
| 5,750,000 A | 5/1998 | Yonehara et al. ......... | 156/630.1 |
| 5,856,229 A | 1/1999 | Sakaguchi et al. .......... | 438/406 |
| 5,869,387 A | 2/1999 | Sato et al. ................... | 438/459 |
| 6,121,117 A | 9/2000 | Sato et al. ................... | 438/459 |
| 6,136,684 A | 10/2000 | Sato et al. ................... | 438/624 |
| 6,143,629 A | 11/2000 | Sato ............................ | 438/455 |

FOREIGN PATENT DOCUMENTS

| | | | |
|---|---|---|---|
| EP | 0 553 859 | | 8/1993 |
| EP | 0 619 603 | | 10/1994 |
| EP | 0 755 068 | | 1/1997 |
| JP | 5-21338 | | 1/1993 |
| JP | 9-100197 | | 4/1997 |
| JP | 10032234 | * | 2/1998 |

OTHER PUBLICATIONS

N. Sato, et al., "Reduction of Crystalline Defects to 50/cm$^2$ in Epitaxial layers over Porous Silicon for ELTRAN Process", Proc. 1998 IEEE Int'l SOI Conf., Oct. 1998, pp. 13–14.
N. Sato, et al., "Defect Engineering in Epitaxial Layers over Porous Silicon for ELTRAN SOI Wafers", Int'l Conf. on Solid State Dev. and Mat., Jpn. Soc. Appl. Phys., Sep. 1998, pp. 302–303.
Patent Abstracts of Japan, vol. 1995, No. 06, Jul. 31, 1995 (corresponds to JP 7–086540).
N. Sato, et al., "Hydrogen Annealed Silicon–on–Insulator", Appl. Phys. Lett., vol. 65, No. 15, pp. 1294–1926 (1994).
T. Yonehara, et al., "Epitaxial Layer Transfer by Bond and Etch Back of Porous Si", Appl. Phys. Lett., vol. 64, No. 16, pp. 2108–2110 (1994).

(List continued on next page.)

Primary Examiner—Charles Bowers
Assistant Examiner—Keith Christianson
(74) Attorney, Agent, or Firm—Fitzpatrick, Cella, Harper & Scinto

(57) ABSTRACT

The present invention provides a semiconductor substrate comprising a non-porous monocrystalline layer with decreased crystal defects which is formed on a porous silicon layer, and a method of producing the substrate. The method of producing the substrate comprises a heat treatment step of heat-treating a porous layer in an atmosphere not containing a silicon type gas, and a step of growing a non-porous monocrystalline silicon layer on the porous silicon layer, wherein the heat treatment step is executed such that the etched thickness of silicon is 2 nm or less and that the rate of change r for the Haze value of the porous silicon layer defined by (the Haze value after the heat treatment)/(the Haze value before the heat treatment) satisfies the relationship between $1 \leq r \leq 3.5$.

38 Claims, 13 Drawing Sheets

OTHER PUBLICATIONS

K. Imai, "A New Dielectric Isolation Method Using Porous Silicon", Solid State Elec., vol. 24, No. 2, pp. 159–164 (1981).

J. B. Lasky, et al., "Silicon–on–Insulator (SOI) by Bonding and Etch–Back", Int'l Elec. Devices Meeting, Washington, DC, pp. 684–687 (1985).

G. Ghidini, et al., "Interaction of $H_2O$ with Si(111) and(100)", J. Electrochem. Soc., vol. 131, No. 12, pp. 2924–2928 (1984).

F.W. Smith, et al., "Reaction of Oxygen with Si(111) and (100): Critical Conditions for the Growth of $SiO_2$", J. Electrochem. Soc., vol. 129, No. 6, pp. 1300–1306 (1982).

N. Sato, et al., "Epitaxial Growth on Porous Si for a New Bond and Etch–Back SOI", Proc. $7^{th}$ Int'l Symp. On Si Mater. Sci. and Tech., Pennington, Electochem. Soc. Inc., pp. 443–453 (1994).

N. Sato et al., "Advanced Quality in Epitaxial Layer Transfer by Bond and Etch–Back of Porous Si", Jpn. J. Appl. Phys., vol. 35, pp. 973–977 (1996).

* cited by examiner

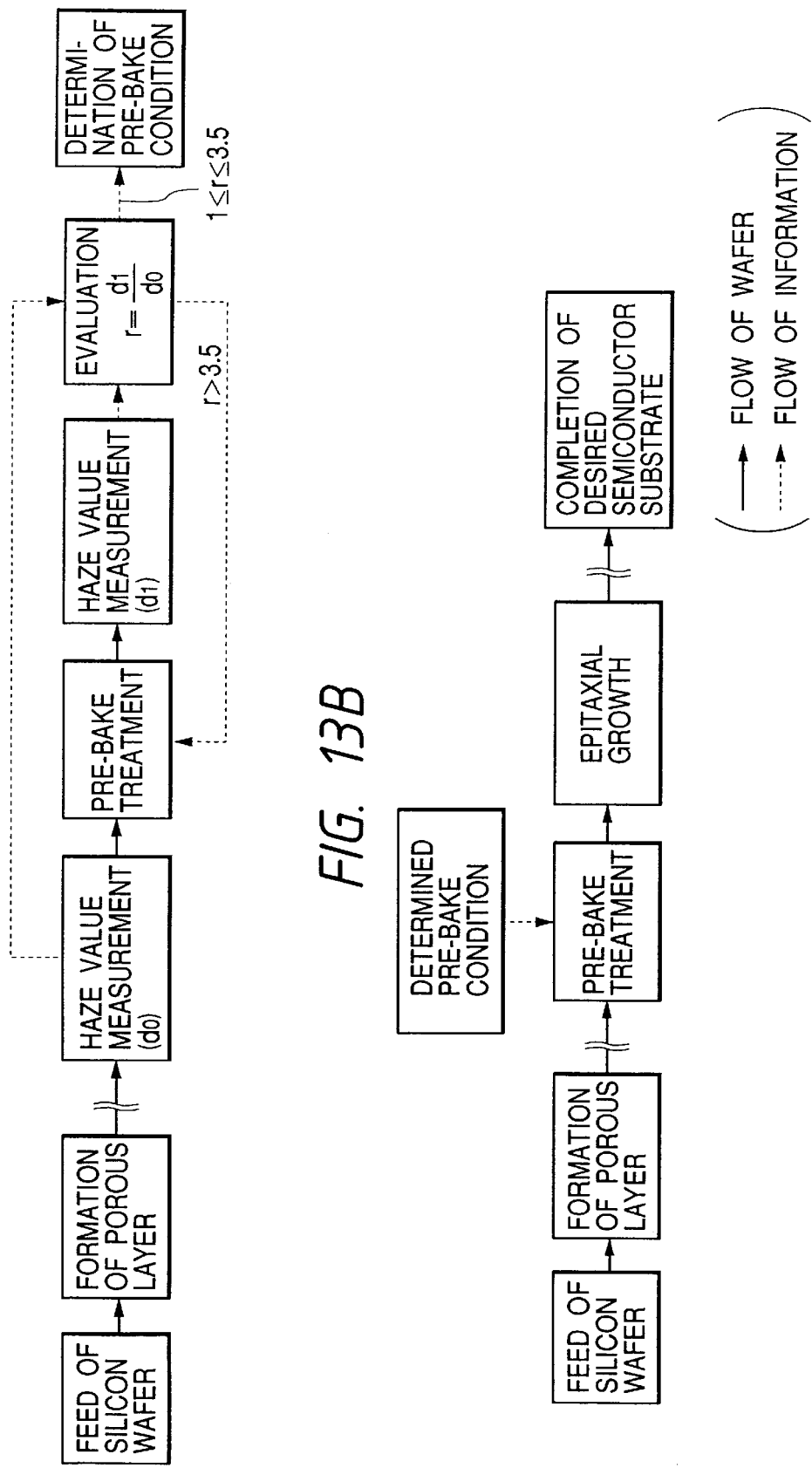

FIG. 15E

SEMICONDUCTOR SUBSTRATE AND METHOD FOR PRODUCING THE SAME

BACKGROUND OF THE INVENTION

1. Field of the Invention

The present invention relates in general to a semiconductor substrate and a method for producing the same and, more particularly to, a non-porous semiconductor layer formed on a porous semiconductor layer and a method for forming the same. Further, the present invention relates to a method of evaluating the shape and state of a surface of a semiconductor substrate, in particular, a porous layer thereof.

The present invention relates also to a semiconductor substrate utilized as a base member for integrated circuits using mainly MOSFETs and bipolar-transistors and a method for forming the same.

2. Related Background Art

Research has been conducted in the integrated-circuit (IC) technologies for silicon-based semiconductor devices to work out a silicon-on-insulator (SOI) structure, in which a monocrystalline silicon film is disposed on an insulator, because the structure reduces parasitic capacitance and facilitates element isolation, thus improving the operation speed of transistor, decreasing the power consumption, improving the integration density, and reducing the total cost.

To form the SOI structure there has been available the Fully Isolation by Porous Silicon (FIPOS) method proposed by Imai in the 1970s through the early 1980s (K. Imai, Solid State Electronics 24 (1981), p. 159). The FIPOS method utilizes the accelerated oxidation phenomenon of porous silicon to form an SOI structure but has a problem that it can inherently form a surface silicon layer only in the shape of islands.

One of the SOI formation technologies attracting the world attention in recent years is the wafer bonding technology, surrounding which have been proposed various methods because the SOI structure provides arbitrariness in the thickness of a surface silicon layer and a buried silicon oxide layer as well as good crystallinity of the surface silicon layer.

Although the bonding method, by which wafers are bonded without an adhesive agent or any other intermediate layers, was proposed originally by Nakamura et al., its research has advanced since 1984, when J. B. Lasky et al. reported the method of thinning one of two bonded wafers and the operation of a MOS transistor formed thereon (J. B. Lasky, S. R. Stiffler, F. R. White, and J. R. Abernathey, Technical Digest of the International Electron Devices Meeting (IEEE, New York, 1985), p. 684).

By the method by Lasky et al., a first wafer which is a monocrystalline silicon wafer incorporated with boron at a high concentration and having formed thereon a low-concentration or n-type epitaxial silicon layer and a second wafer having an oxide film formed on a surface thereof are provided and rinsed, as necessary, and are then brought into close contact with each other, so that the two wafers are bonded to each other by the van der Waals force. The two wafers undergo heat treatment to form covalent bonds therebetween, whereby the bonding strength is enhanced to such a level as not to disturb the production of devices. Then, the first wafer is etched on its back side with a mixture liquid of hydrofluoric acid, nitric acid, and acetic acid, to selectively remove the $p^+$ silicon wafer so that only the epitaxial silicon layer remains on the second wafer, which is called also the single etch-stop method. However, the ratio of the etch rate for the $p^+$ silicon to that for the epitaxial silicon ($p^-$ or n type) is as low as several 10s, thus requiring further improvements to leave a uniform thickness of an epitaxial silicon layer on the entire wafer surface.

Thus, a method has been worked out for conducting selective etching twice. That is, as a first substrate is provided a low-impurity-concentration silicon wafer substrate on a surface of which are stacked a $p^{++}$ type Si layer and a low-impurity-concentration layer; then this first wafer is bonded to such a second wafer as described above. Then, the first substrate is thinned by grinding, polishing, or any other mechanical method on its back side. Next, the first substrate undergoes selective etching until the whole surface of the $p^{++}$ Si layer buried in the first substrate is exposed. In this case, selective etching due to the difference in the impurity concentration of the substrate is effected by using an alkaline liquid such as ethylene diamine pyrocatechol, KOH, etc. Then, the exposed $p^{++}$ Si layer is selectively removed by the selective etching by use of a mixture liquid of hydrofluoric acid, nitric acid, and acetic acid as is the case with the above-mentioned Lasky method, so that only the above-mentioned low-impurity-concentration monocrystalline Si layer is transferred onto the second substrate, which is called the double etch-stop method. This method, by carrying out selective etching a plurality of times, has proved to improve the overall etch selectivity, resulting in a better uniformity in the thickness of the surface Si layer in the SOI.

However, it may be anticipated that the thinning of layers by means of selective etching utilizing the above-mentioned difference in the impurity concentration or composition of the substrate would be affected by the depth profile of the impurity concentration. That is, if the wafers, after the bonding, are heat-treated at a high temperature in order to enhance the bonding strength, the impurity in the buried layer diffuses, so that the etch selectively degrades, resulting in lowering in the uniformity of film thickness. Therefore, the heat treatment after bonding had to be carried out at 800° C. or less. Moreover, because each of the plural times etching would provide a low etch selectivity, the controllability at the time of mass-production was of concern.

In contrast to the above-mentioned method, in which etch selectivity depends on a difference in impurity concentration or composition, Japanese Patent Application Laid-Open No. 5-21338 employs a difference in structure to provide etch selectivity. That is, this method implements an etch selectivity as high as 100,000 due to structural difference between porous silicon with a surface area per unit volume such as 200 $m^2/cm^3$ and non-porous silicon, which is called a selective etching method utilizing a structural difference using porous silicon. By this method, a surface of a monocrystalline Si wafer given for a first substrate is anodized to make porous, after which a non-porous monocrystalline silicon layer is epitaxially grown thereon to provide the first substrate. Then, it is bonded to a second substrate and undergoes heat treatment as necessary to enhance the bonding strength. Subsequently grinding, polishing or the like is carried out to remove the back side of the first substrate, thus exposing the porous silicon layer in its entirety. Next, the porous silicon is selectively removed by etching to, with the result that the above-mentioned non-porous monocrystalline silicon layer is transferred onto the second substrate. Since a high etch selectivity as much as 100,000 was obtained, the uniformity in the thickness of the SOI layers obtained was impaired little by the etching, reflecting the uniformity of the monocrystalline silicon layer during the epitaxial growth as such. That is, as is the case with a commercially available CVD epitaxial growth apparatus, this method attains an in-wafer uniformity, for example 1.5% to 3% or less, for the SOI-Si layer. This method uses, as the material for selective etching, the porous silicon which is used as the material for selective oxidation in the FIPOS method. Therefore, this method does not limit the porosity to about 56% but prefers a rather low value of about 20%. Note here that the method for producing SOI structures disclosed in the above-mentioned Japanese Patent Application Laid-Open No. 5-21338 was named ELTRAN (trademark) in a report by Yonehara et al. (T. Yonehara, K. Sakaguchi, N. Sato, Appl. Phys. Lett. 64 (1994), p. 2108).

Also, since porous silicon will not become the structural member of a final product, the structural change and the coarsening of porous silicon are tolerated as far as they will not impair the etch selectivity.

Sato et al., the inventor of the present invention, conducted a Chemical Vapor Deposition (CVD) method using a $SiH_2Cl_2$ gas as the source gas for the epitaxial growth on a porous substance at process temperatures of 1040° C. for heat treatment before epitaxial growth and 900 to 950° C. during epitaxial growth (N. Sato, K. Sakaguchi, K. Yamagata, Y. Fujiyama, and T. Yonehara, Proc. of the Seventh Int. Symp. on Silicon Mater. Sci. and Tech., Semiconductor Silicon, (Pennington, The Electrochem. Soc. Inc., 1994), p. 443).

To avoid structural coarsening of porous silicon during heat treatment at a high temperature, Sato et al. introduced, prior to the epitaxial growth step, a preoxidation step of forming a protective film at the walls of porous silicon pores to almost suppress the structural coarsening of the porous silicon layer involved in the heat treatment. The preoxidation is carried out, for example, at 400° C. in oxygen atmosphere.

A key factor to this method is how to reduce the defects formed during the epitaxial growth of non-porous monocrystalline silicon on porous silicon. Thus made SOI wafers have stacking fault as the main defect and, reportedly, has a stacking fault density of $10^3$ to $10^4/cm^2$ in an epitaxial silicon layer on porous silicon.

It is generally pointed out that stacking faults may degrade the dielectric strength of oxide films. This is considered because when a metal impurity precipitates at a dislocation portion surrounding a stacking fault, a leakage current of a p-n junction would increase, thereby degrading the life time of minority carriers. The other reports on the epitaxial growth on a porous substance did not refer to a crystal defect density of less than $10^3/cm^2$ by means of observation with an optical microscope after defect revealing etching with a lower detection limit. Although the probability of stacking faults of $10^3$ to $10^4/cm^2$ being in a gate region of 1 $\mu m^2$ is as low as 0.0001 to 0.00001, as compared to a bulk silicon wafer, the defect density is still high and so expected to be revealed as decreases in the yield of IC production. For practical application of SOI wafers obtained by the above-mentioned method, it is necessary to reduce the stacking fault density to at least $1000/cm^2$.

Further, when non-porous monocrystalline silicon is epitaxially grown on a porous silicon layer, introduction of many stacking faults are caused by "porous structure" of a supporting base member for the epitaxial growth.

As the conventional method of evaluating or observing the porous structure, in particular, a surface shape and a surface state thereof, a method of directly observing them with SEM or the like is used but is complicated as means therefor. Therefore, a method of simply and easily evaluating them has been required.

SUMMARY OF THE INVENTION

A first object of the present invention is to provide a semiconductor substrate having a non-porous monocrystalline layer with decreased crystal defects on a porous silicon layer and a method for producing the substrate.

A second object of the present invention is to provide a substrate having a non-porous monocrystalline layer with less crystal defect density on an insulator and a method for producing the substrate.

A third object of the present invention is to provide a method of simply and easily evaluating the surface state of a porous layer and to decrease the stacking fault density of a thin film formed on a porous layer by utilizing the evaluation method.

According to a first aspect of the present invention, there is provided a method of producing a semiconductor substrate comprising a non-porous monocrystalline layer on a porous silicon layer, which comprises, before a step of forming the non-porous monocrystalline layer on the porous silicon layer, a step of heat-treating the porous silicon layer in an atmosphere not containing a source gas of the non-porous monocrystalline layer, wherein a condition of the heat treatment is determined such that a rate of change r for Haze values of the porous silicon layer surface before and after the heat treatment defined by (the Haze value of the porous silicon layer surface after the heat treatment)/(the Haze value of the porous silicon layer surface before the heat treatment) is in a predetermined range.

According to a second aspect of the present invention, there is provided the above-mentioned method, wherein the predetermined range is $1 \leq r \leq 3.5$.

According to a third aspect of the present invention, there is provided a method of producing a semiconductor substrate, which comprises a step of providing a substrate comprising a porous silicon layer, a heat treatment step of heat-treating the porous silicon layer, and a growth step of growing a non-porous monocrystalline layer on the porous silicon layer, wherein the heat treatment step is conducted in an atmosphere not containing a source gas of the non-porous monocrystalline layer such that the thickness of a portion which has been etched to be removed (hereinafter referred to as "etched thickness") of silicon due to the heat treatment is not more than 2 nm and that the rate of change r for the Haze value of the porous silicon layer surface defined by (the Haze value after the heat treatment)/(the Haze value before the heat treatment) satisfies the relationship of $1 \leq r \leq 3.5$.

According to a fourth aspect of the present invention, there is provided a method of producing a semiconductor substrate, which comprises a step of providing a first substrate comprising a porous silicon layer, a heat treatment step of heat-treating the porous silicon layer, a growth step of growing a non-porous monocrystalline layer on the porous silicon layer, and a step of transferring the non-porous monocrystalline layer grown on the first substrate onto a second substrate, wherein the heat treatment step is conducted in an atmosphere not containing a source gas of the non-porous monocrystalline layer such that the etched thickness of silicon due to the heat treatment is not more than 2 nm and that the rate of change r for the Haze value of the porous silicon layer surface defined by (the Haze value after the heat treatment)/(the Haze value before the heat treatment) satisfies the relationship of $1 \leq r \leq 3.5$.

BRIEF DESCRIPTION OF DRAWINGS

FIGS. 13A and 13B are flowcharts illustrating one example of a system for determining pre-bake conditions and a process for producing a semiconductor substrate under the determined conditions, respectively;

FIGS. 15A, 15B, 15C, 15D and 15E are schematic views illustrating the steps of producing a SOI substrate according to the present invention.

DESCRIPTION OF THE PREFERRED EMBODIMENTS

Figure 1:
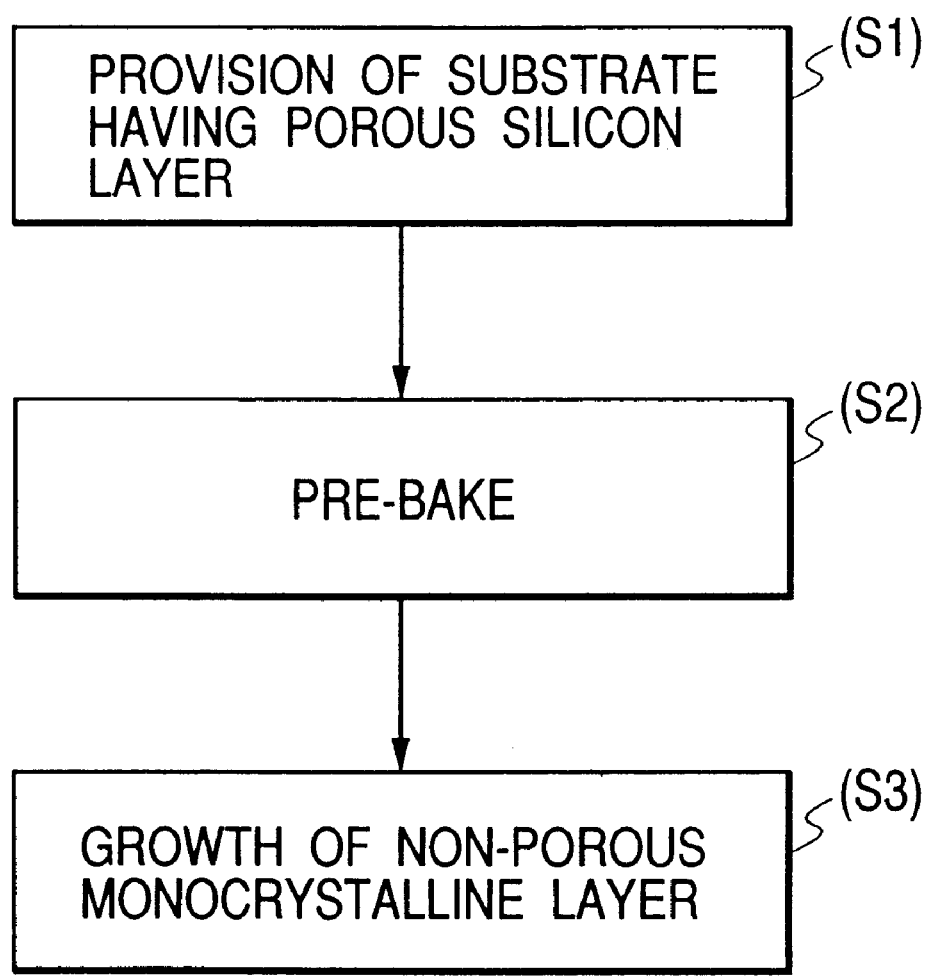
FIG. 1 is a flowchart illustrating a method of forming a non-porous monocrystalline layer on a porous silicon layer.

First, a method is explained for forming a non-porous monocrystalline layer (epitaxial growth layer) on a porous silicon layer with reference to the flowchart of FIG. 1.

First, a substrate is provided which has a porous silicon layer (S1). Next, prior to the growth of a non-porous monocrystalline layer, the porous silicon layer is heat-treated in an atmosphere not containing a source gas of the non-porous monocrystalline layers.

This heat treatment is called a pre-bake step (S2), by which a native oxide film formed on the surface of the porous silicon layer are, for example, removed.

Note here that the above-mentioned heat treatment "in an atmosphere not containing a source gas of a non-porous monocrystalline layer" refers specifically to that in a reducing atmosphere containing hydrogen gas, an atmosphere of an inert gas such as He, Ar, Ne, etc., or ultra-high vacuum.

After the above-mentioned pre-bake step, a source gas is introduced to grow a non-porous monocrystalline layer (S3). Thus, the non-porous monocrystalline layer is grown on the porous silicon layer.

Before the embodiments of the present invention are described, the technical finding by which the present invention has been accomplished is described below.

Figure 3:
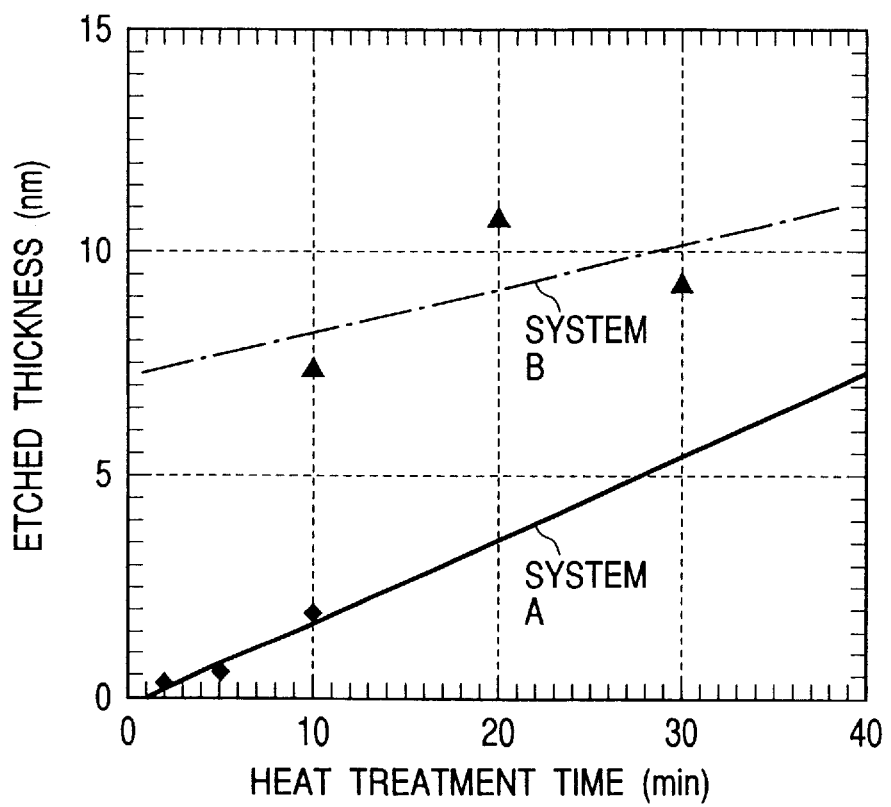
FIG. 3 is a graph explaining an etched thickness of silicon in an epitaxial growth apparatus.

(Experiment 1: Difference in Etched Thickness of Si at Temperature Up Step Before Epitaxial Film Growth FIG. 3 shows the time dependency of a decreased etched thickness of non-porous monocrystalline silicon by etching of a surface thereof in two epitaxial growth systems A and B. The system A is one having an apparatus provided with a load-lock chamber, and the system B is one having an open type reaction chamber without a load-lock chamber.

Specifically, as detailed below, the apparatus of the system A is provided with a load-lock chamber to allow taking in and out of wafers without directly exposing a reaction chamber to the atmosphere.

The leakage amount from the reaction chamber is preferably 20 mTorr/min or less, more preferably 10 mTorr/min or less.

Also, the leakage amount from a gas panel of the gas supply system is preferably 0.5 psi/24 h, more preferably 0.2 psi/24 h.

Also again, as the supply gas, a highly purified gas is preferable. Specifically, when, for example, $H_2$ gas is used to carry out the pre-bake step, it is preferable to use $H_2$ gas that passed through a gas purifier located within about 20 meters, preferably about 10 meters from the apparatus. As the purifier, there are preferably used one the type for passing the gas through heated palladium diffusion cells or the filter type one having an adsorbent.

Figure 2:
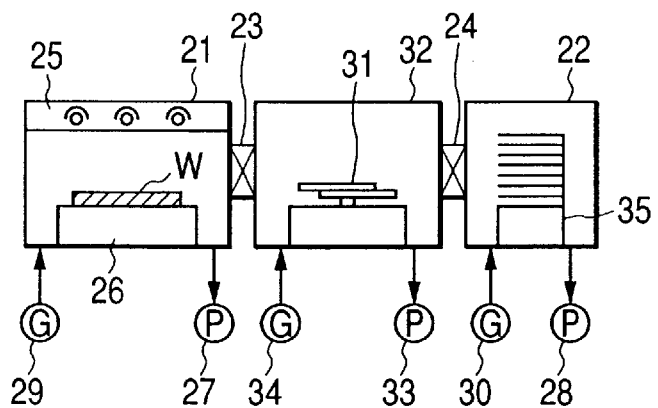
FIG. 2 is a schematic view illustrating one example of an apparatus provided with a load-lock chamber.

FIG. 2 shows a schematic view of the treatment apparatus, in which reference numeral 21 denotes a reaction chamber (process chamber), reference numeral 22 denotes a load-lock chamber, reference numeral 32 denotes a carrier chamber (transport chamber), a reference numeral 23 denotes a gate valve which provides a partition between the reaction chamber 21 and the carrier chamber 32, and reference numeral 24 denotes a gate valve which provides a partition between the carrier chamber 32 and the load-lock chamber 22. Reference numeral 25 denotes a heater such as a lamp for heating substrate W, reference numeral 26 denotes a susceptor for holding the substrates W thereon, reference numerals 27, 28, and 33 denote exhaust systems for exhausting respectively the reaction chamber 21, the load-lock chamber 22, and the carrier chamber 32, reference numeral 29 denotes a gas supply system for introducing a processing gas into the reaction chamber 21, and reference numerals 30 and 34 denote gas supply systems for introducing a gas respectively into the carrier chamber 32 and the load-lock chamber 22 to purge or pressure-increase the inside thereof. Reference numeral 31 denotes a carrier arm for carrying the substrate W in or out of the reaction chamber 21. Reference numeral 35 denotes a wafer cassette. Further, there can be used such a modification that the load-lock chamber 22 is integrated with the carrier chamber 32 for housing the carrier arm, instead of separating it from the carrier chamber 32 with the gate valve 24.

Note here that heat treatment conducted using such a treating apparatus equipped with a load-lock chamber is referred to as "heat treatment in system A" for convenience.

In the system A, the heater of the reaction chamber can be energized beforehand to pre-heat the susceptor, etc. to 600 to 1000° C.

By using this method, it is possible to increase the temperature of a wafer put into the reaction chamber up to 600 to 1000° C. in about 10 seconds, thus enabling to reduce the temperature up time and also to suppress the progressing of change in pore state at the porous silicon surface due to this heat treatment.

In system A, the heat treatment was conducted at 1100° C. and at 600 Torr, while in system B, it was conducted at 1050° C. and at 760 Torr, and the heat-treating atmosphere was hydrogen for both systems. The etched thickness was determined by using an SOI substrate and measuring an amount of decrease in thickness of the SOI layer, i.e. the monocrystalline silicon layer.

In system B, even with the heat treatment time being zero, the etched thickness is as much as 7 nm or more. This refers to the etched thickness when the substrate to be treated was heated to the set temperature and then cooled immediately. This means that only with a temperature rise, the silicon film thickness decreased by as much as about 7 nm.

In system A, on the other hand, even with 10 minutes of heat treatment, the etched thickness is 2 nm or less. Incidentally, it is known that in system A, the etched thickness with the lapse of the heat treatment time is larger at 1100° C. than at 1050° C. of the set temperature.

Thus, the difference in the amount of oxygen and water contents in the reaction chamber could be known by the decrease due to etching in the film thickness of silicon oxide formed by the oxidation of silicon.

The amount of oxygen and water in the reaction chamber is determined by the purity of a gas supplied, the adsorbed water amount in a supply line, the minute leak, the airtightness of the reaction chamber itself, and the contamination of the reaction chamber when carrying a substrate thereinto. The degree of contamination of the reaction chamber with oxygen or water at the time of carrying a substrate thereinto is largely influenced by whether the substrate is introduced through a load-lock into the reaction chamber (system A) or it is introduced into the reaction chamber opened to the atmosphere. However, even in the case of system B where the substrate is carried into the reaction chamber opened to the atmosphere, as far as the gas in the chamber is sufficiently replaced without temperature rise, the residual oxygen and water amounts are reduced, but the efficiency is not sufficient for mass production. Also, the etched thickness is influenced by the time required for temperature rise to a set temperature. The rate of temperature rise can be increased when the substrate is supported on a substrate holder with a small heat capacity.

It is reported in F. W. Smith et al., J. Electrochem. Soc. 129, 1300 (1982) and G. Ghidini et al., J. Electrochem. Soc. 131, 2924 (1984) that when a slight amount of oxygen or water is present in a system, and when the concentration thereof is low, silicon is etched.

When the concentration of water, etc. is high, on the other hand, silicon is oxidized to form a silicon oxide. The thus formed silicon oxide reacts with adjacent silicon as the temperature rises, thereby being etched. That is, the following reaction takes place.

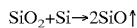
$$SiO_2 + Si \rightarrow 2SiO\uparrow$$

After all, oxygen or water remaining in the system contributes to the etching of silicon during temperature rise, so that the amount of residual oxygen and water in the reaction chamber can be known by checking the amount of silicon etched.

Figure 4:
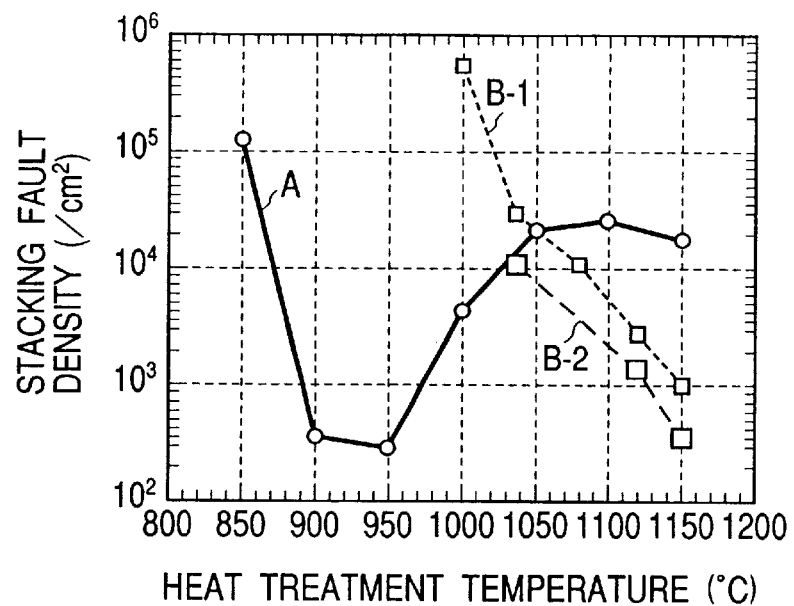
FIG. 4 is a graph explaining relationships between heat treatment temperature and stacking fault density when different epitaxial growth apparatuses are used.

Experiment 2: Relationship Between Pre-bake Temperature and Stacking Fault Density FIG. 4 shows the heat treatment temperature (pre-bake temperature) dependency of the density of stacking faults which are introduced to non-porous monocrystalline silicon formed on a porous silicon layer in the systems A and B. The pressure within the system A is 600 Torr, and both pressures within the systems B-1 and B-2 are 760 Torr.

The data indicated by the systems B-1 and B-2 of FIG. 4 are reported by N. Sato, et al. (N. Sato, et al. Jpn. J. Appl. Phys. 35 (1996) 973). The stacking fault densities of the systems B-1 and B-2 decrease by increasing the pre-bake temperature. The data indicated by the system B-2 are obtained by decreasing the supply amount of a silicon source gas at an initial stage of crystal growth and remarkably suppressing a crystal growth rate. The stacking fault density in the case of the system B-2 is about ⅓ times as large as in the case of the system B-1 without depending the temperature. However, the stacking fault density in each case of the systems B-1 and B-2 is decreased only by making the heat treatment temperature higher.

The reason why the increase of the pre-bake temperature makes the stacking fault density lower is described below. In the cases of the systems B-1 and B-2 where the etched thickness of silicon is as large as about 7 nm, silicon oxide is formed once on a silicon surface at the temperature rise step by residual oxygen and water. In a lower temperature region, the formed silicon oxide is not completely removed, and therefore the stacking fault density is large. However, it is considered that by sufficiently increasing the heat treatment temperature and time, the formed silicon oxide is removed, whereby the stacking fault density starts to decrease.

On the other hand, in the case of the system A, the stacking fault density is $10^4/cm^2$ level in a higher temperature region exceeding 1000° C. and it does not remarkably decrease by increasing the heat treatment temperature, as compared with the cases of the systems B-1 and B-2. However, as lowering the temperature, there was the minimum value of the stacking fault value near 950° C., and the stacking fault density decreased to about $10^2/cm^2$ at 950° C.

Namely, it is found that in the case of the system A where the etched thickness of silicon is as small as 2 nm or less, the stacking fault density can be decreased without the porous structure change and coarseness, which is different from the cases of the systems B-1 and B-2 where the etched thickness of silicon is large.

From the above, the technical finding has been obtained that the important role for introducing the stacking faults to a non-porous monocrystalline silicon layer is a silicon amount removed by etching from the surface of a porous silicon layer during a time after the arrangement of a substrate having a porous silicon layer formed thereon in an epitaxial growth apparatus until the starting of formation of a non-porous monocrystalline layer by introducing a silicon source gas into a reaction vessel, i.e., the thickness decrease amount of the porous silicon layer.

Experiment 3: Relationship Between Haze Level and Stacking Fault Density

In order to clarify the reason why the stacking fault density has the minimum value near 950° C., a substrate having a porous silicon layer formed thereon is subjected to only a pre-bake treatment in a reaction vessel. Then it is taken out from the reaction vessel, and the Haze level of the surface of the formed porous silicon is measured by using a commercially available particle-inspecting apparatus.

Since particle-inspecting apparatuses are commercially sold from a plurality of apparatus makers, one was selected from them and used as the particle-inspecting apparatus for detecting the position, size and the like of particles on a mirror-finished surface of a silicon wafer to carry out the Haze level measurement. In these apparatus, a silicon wafer is irradiated with a laser light and not a regular reflection light but a scattered light is monitored to detect particles. The laser light or the silicon wafer is moved to shift a laser incident position within the wafer and a scattered light intensity in each position is monitored while corresponding to a coordinate position. When a laser light is shifted to a position where a particle is present, the laser light is scattered by the particle to increase the scattered light intensity.

Figure 16:
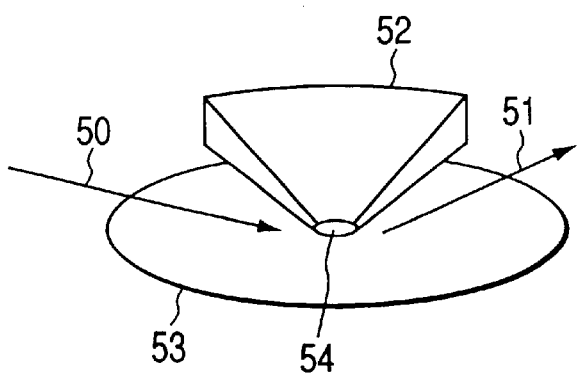
FIG. 16 is a schematic view illustrating a particle inspecting apparatus.

FIG. 16 is a schematic view of observation with Surfscan 6420 manufactured by Tencor Company. The scattered light intensity is previously corrected by using a standard particle such as a latex particle and then converted into a particle size. This manner has been employed in many particle-inspecting apparatuses commercially sold at present. In FIG. 16, numeral 50 indicates an incident light; 51, a reflected light; 52, a scattered light; 53, a silicon wafer; and 54, an observation region.

The surface of a silicon wafer is mirror-finished by chemical polishing. However, by micro-observation such as observation with an atomic force microscope or a light interference microscope, it is confirmed that the surface is not completely flat and that it has uneven components with various cycles and amplitudes such as micro-roughness and undulation with a long cycle. When the surface unevenness is irradiated with a laser light used in the particle-inspecting apparatus, a very small scattered light component generates on the surface unevenness. Though the particle is locally observed, such scattered light is observed in a wide region. When the irradiation position of the laser light is shifted, the scattered light generated on the surface unevenness continuously gives a constant intensity without sudden change of a signal intensity at a position of the particle.

In other words, such constant intensity can be said to be a direct current (DC) component or a background component. By removing the sudden signal change due to the particle and observing a continuous scattered light component, the surface unevenness can be monitored, and this is referred to as "Haze".

Haze is generally expressed as a ratio (ppm) of a scattered light intensity to a regular reflection light intensity or an incident light intensity. Since the detection position of the incident light is different from that of the scattered light in each apparatus, it is difficult to compare absolute values of the intensities of both lights.

The scattered light intensity is generally at most several ten ppm order, and therefore the ratio with respect to the regular reflection light is almost the same as the ratio with respect to the incident light.

The commercially available particle-inspecting apparatuses have been improved in the incident angle and wavelength of a laser light, the monitor position of a scattered light and the like.

It is well known that a laser light used as an incident light does not completely reflect on a surface and penetrates into silicon. The depth of the penetration depends on the wavelength of the laser light.

Porous silicon has a structure with many ultra-fine pores formed by etching from the surface of a silicon wafer. The penetrated laser light is scattered by the side wall of the pores.

Accordingly, by irradiating the surface of porous silicon with a laser light and observing the scattered light, it is possible to obtain information which reflects the surface of a porous layer and the porous structure near the surface.

The present inventor has obtained a technical finding that in formation of a non-porous monocrystalline silicon layer on porous silicon, a Haze value immediately before formation of the non-porous monocrystalline silicon layer, that is, immediately after the pre-bake step is correlated with the stacking fault density introduced into the non-porous monocrystalline silicon layer.

The present inventor also has obtained another technical finding that porous silicon is arranged in an epitaxial growth apparatus, its temperature is risen, a silicon source gas is introduced thereto and a heat treatment is executed, which is a step immediately before formation of the non-porous monocrystalline silicon layer, and the Haze value of porous silicon taken out from the apparatus is controlled within a predetermined range, thereby suppressing the stacking fault density of a non-porous monocrystalline silicon layer.

Porous silicon was formed by anodization in a mixed solution of HF, $C_2H_5OH$ and $H_2O$ and then subjected to a heat treatment at 400° C. in an oxygen atmosphere for one hour (this treatment is referred to as "preoxidation"). Next, it was immersed in an aqueous solution of 1.25% HF for about 25 seconds, rinsed with water, dried and set in an epitaxial growth apparatus.

Figure 5:
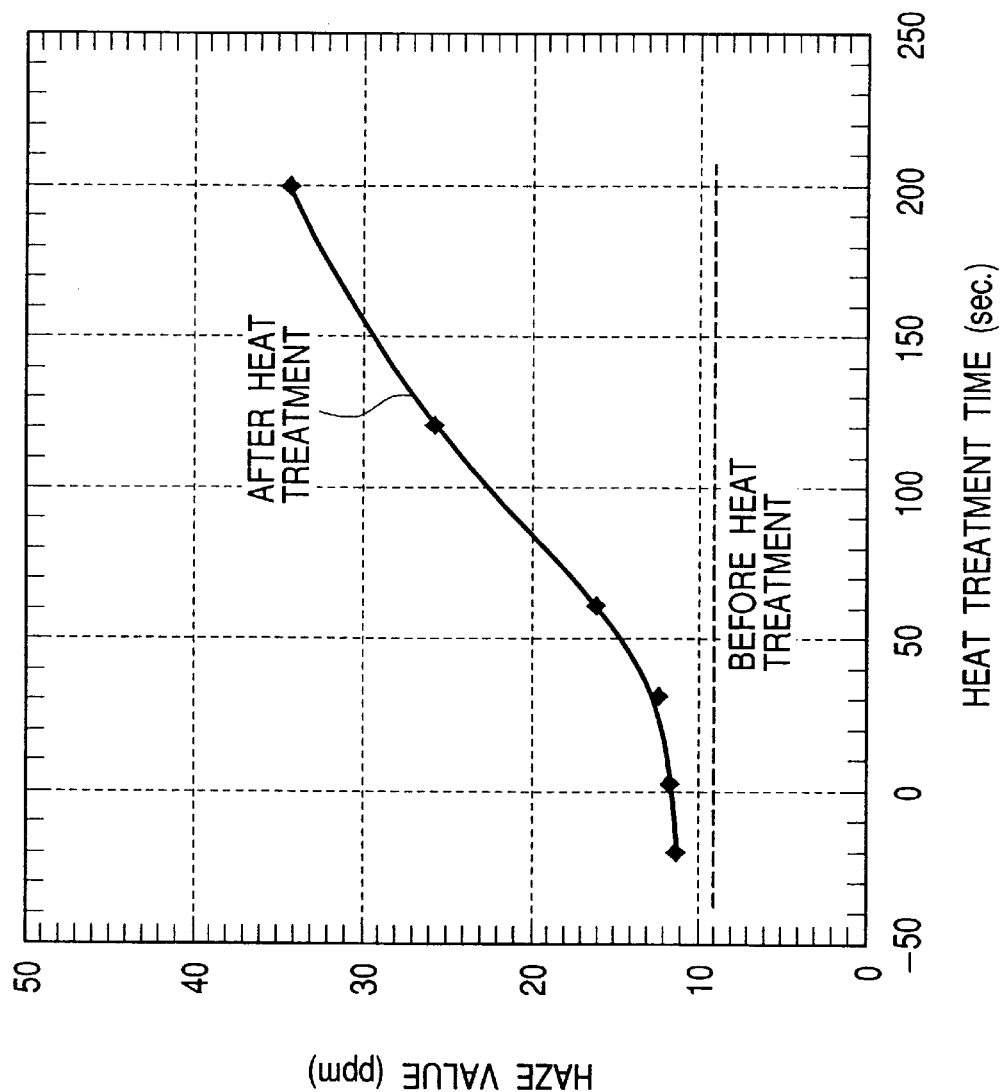
FIG. 5 is a graph explaining the change of Haze values by heat treatment of porous silicon.

The porous silicon was subjected to only a heat treatment at 950° C. under 600 Torr in the apparatus and then taken out from the apparatus. Haze value thereof was measured with a particle-inspecting apparatus and its result is shown in FIG. 5.

The Haze value after the preoxidation was about 6 and increased to about 9 after the HF solution treatment.

In the above-mentioned heat treatment of porous silicon set in the epitaxial growth apparatus, as a heat treatment time became longer, the Haze value started to increase and after 2, 30, 60 and 120 seconds, the Haze value was 11.9, 12.7, 16.3 and 25.7, respectively. The Haze value of the surface of a commercially available silicon wafer was 0.18.

Figure 6:
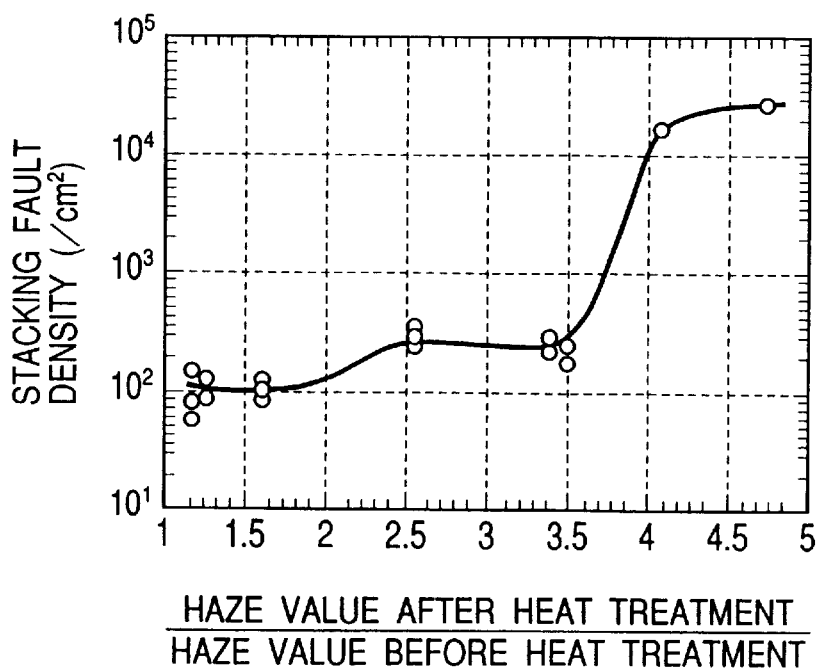
FIG. 6 is a graph explaining a relationship between the rate of change of Haze values and the stacking fault density.

FIG. 6 shows a correlation between the stacking fault density and the Haze value obtained by varying the temperature and time of the heat treatment executed before growth of a non-porous monocrystalline layer.

It was found from FIG. 6 that the stacking fault density was maintained at a low level when the increase of the Haze value was within four times, more preferably within two times as large as the Haze value before the heat treatment. It is considered that the increase of the Haze value is caused by change of a porous structure.

Figure 7A:
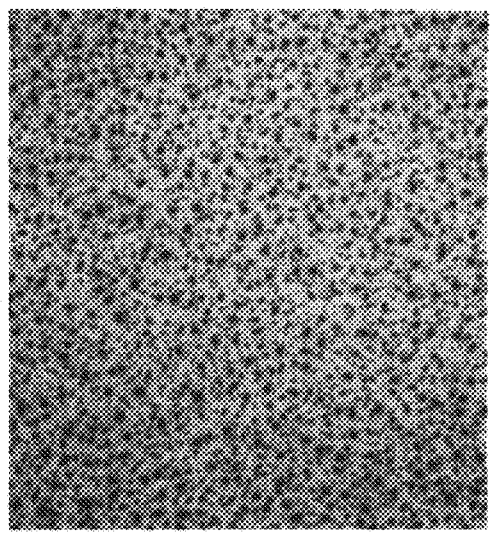
FIGS. 7A, 7B and 7C are SEM photographs explaining the change of surface pores of a porous layer by heat treatment.
Figure 7B:
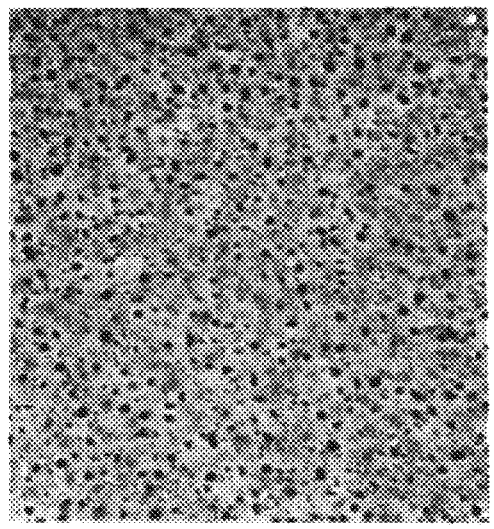
Figure 7C:
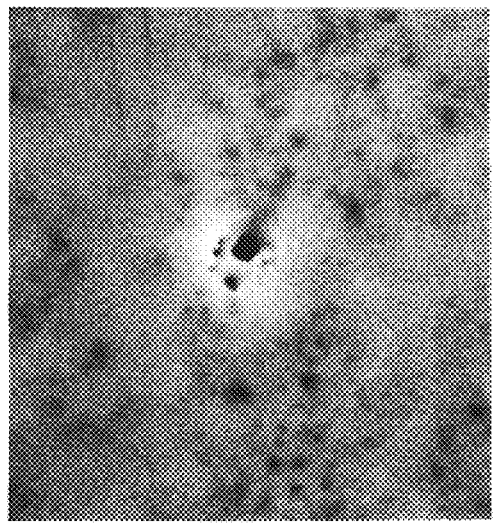
Figure 8A:
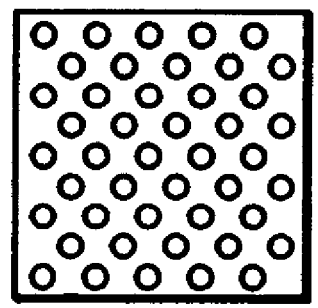
FIGS. 8A, 8B and 8C are schematic views explaining the change of surface pores of a porous layer by heat treatment.
Figure 8B:
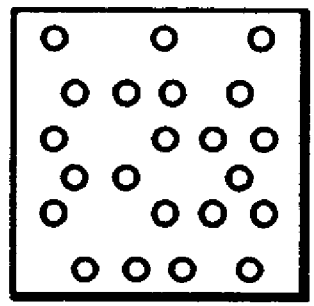
Figure 8C:
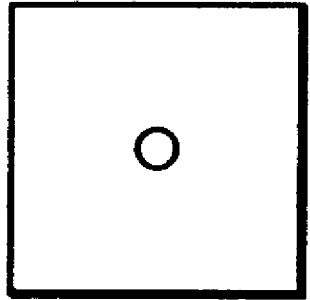

FIGS. 7A, 7B and 7C are high-resolution scanning electron microscope photographs of observing the surface of a porous silicon layer before setting it in an epitaxial growth apparatus, after 950° C. for 2 seconds, and after 1110° C. for 2 seconds, respectively. Their Haze values are 9, 11.9 and 45. FIGS. 8A, 8B and 8C are schematic views illustrating the images of FIGS. 7A, 7B and 7C, respectively.

FIG. 7A is a SEM photograph of the porous silicon surface immediately before setting it in the epitaxial growth apparatus. Pores of about 10 nm in diameter are formed thereon at the density of $10^{11}/cm^2$. FIG. 7B is a SEM photograph of the porous silicon surface after subjecting it to only the heat treatment of 950° C. under 600 Torr for 2 seconds. The pore density in this case decreases but is still $10^{10}/cm^2$ order.

On the other hand, by the observation of the porous surface treated at 1100 °C. for 2 seconds, the pore density remarkably decreased to about $10^6/cm^2$. As shown in FIG. 7C, the pore size of residual pores became larger and there was a pore of about 40 nm in diameter at maximum. The increase of the pore size is caused by oxidation due to residual oxygen and water, etching, enlargement due to surface diffusion, combination of adjacent pores and the like. From clearly seen from these drawings, as the heat treatment temperature becomes higher, the pore density wholly decreases on the porous surface to form a smooth surface. However, the pore size of the residual pores increases, and this shows that severe migration of silicon atoms is generated on and near the surface. From the sectional observation, it is found that as the heat treatment temperature becomes higher, change of a porous structure immediately under the surface is advanced together with enlargement of the pores. That is, increase of the Haze value in the order of FIG. 7A→FIG. 7B→FIG. 7C means that the Haze value reflects influence from these structural changes of a porous layer surface and in a porous layer. The stacking fault densities of the cases of FIGS. 7B and 7C are $1\times10^2/cm^2$ and $2\times10^4/cm^2$, respectively.

The change of the Haze value of a porous layer by a heat treatment executed after setting a substrate having porous silicon in an epitaxial growth apparatus in which the etched thickness of silicon can be controlled in a range of 2 nm or less, preferably 1 nm or less until introduction of a silicon source gas can be controlled within 4 times, more preferably 2 times as large as the Haze value before the heat treatment. It was found that this control decreased the conventional stacking fault density of $10^3$ to $10^4/cm^2$ order to about $1\times10^2/cm^2$. However, as described above, in a system of a large etched thickness of silicon, it is difficult to decrease the stacking fault density at a lower temperature because of a large oxidation amount. This is because an oxidation amount for the time of rising a temperature is large in a growth system of a large etched thickness of monocrystalline silicon.

Additionally, by supplying a slight amount of silicon atoms or a silicon source gas at an initial growth stage as described in Japanese Patent Application Laid-Open No. 9-100197, decrease of the crystal defects according to the present invention can be made more effective.

Figure 9:
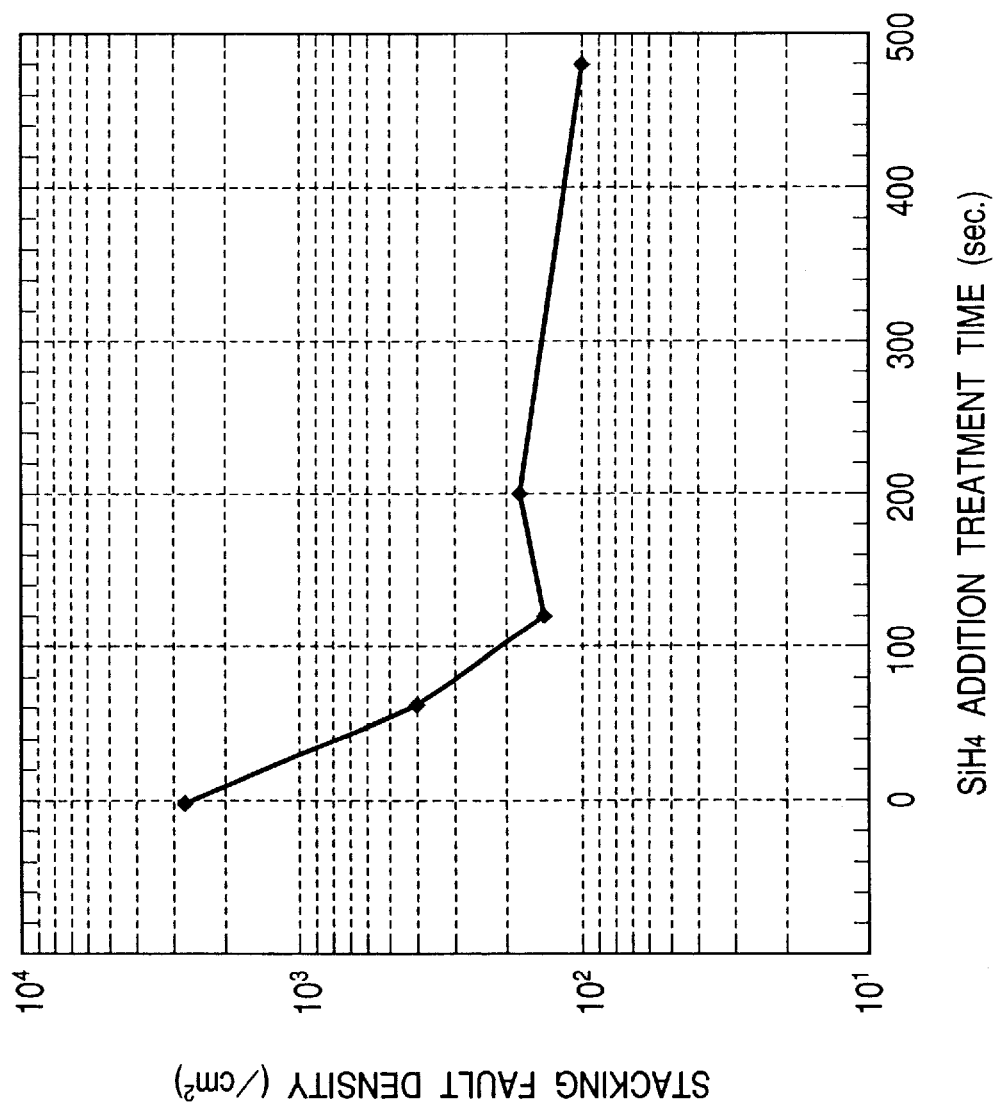
FIG. 9 is a graph explaining a relationship between time for adding a slight amount of silicon raw material and stacking fault density.

As the example of the present invention, a substrate having a porous layer previously formed was set through a load-lock chamber on a susceptor coated with carbon CVD-SiC and maintained at 750° C. in an atmosphere of hydrogen (43 liter/min.) under 600 Torr. The heat treatment temperature was increased at a rate of about 100° C./min. to 950° C. and this temperature was kept for 2 seconds. Then, a slight amount of $SiH_4$ was added as the concentration of about 28 ppm for a predetermined time. Next, the flow rate of a silicon source gas was increased to form a non-porous monocrystalline silicon film of a desired thickness. FIG. 9 shows a dependency of a stacking fault density on an $SiH_4$ addition treatment time. It is clearly found that the density of crystal defects such as stacking faults is decreased by the $SiH_4$ addition treatment of a slight amount.

Figure 10:
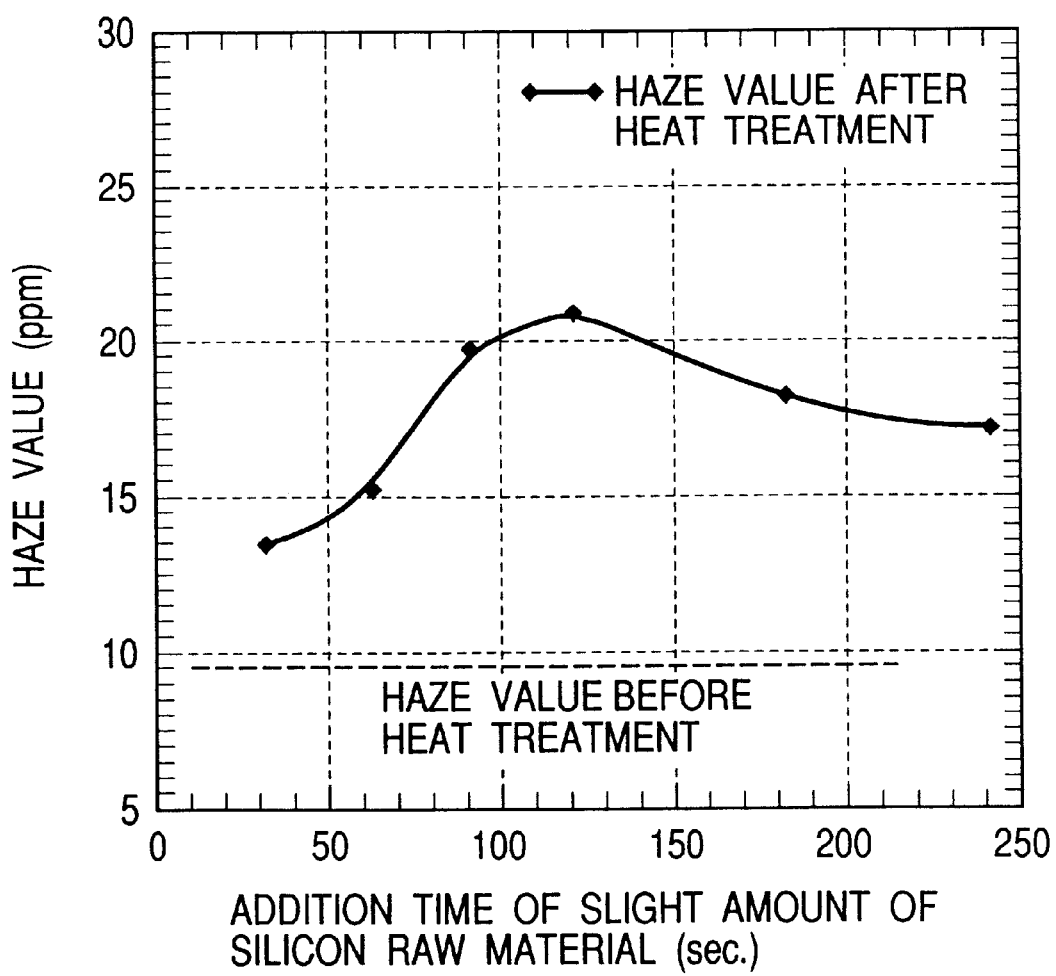
FIG. 10 is a graph explaining the change of Haze values by supplying a slight amount of silicon.

After executing the initial growth by silicon supply of a slight amount, the substrate was taken out from the epitaxial growth apparatus and the Haze value was measured. The result of the measurement is shown in FIG. 10. As can be clearly seen from FIG. 10, by the supply treatment of a slight amount of silicon, the Haze value increases once and then starts to decrease again. As shown in FIG. 10, it is effective that the step of supplying a slight amount of silicon is executed until at least a decrease tendency of the Haze value can be obtained.

Porous silicon was formed by anodization in a mixed solution of HF, $C_2H_5OH$ and $H_2O$ and then subjected to a heat treatment at 400° C. in an oxygen atmosphere for one hour. Next, it was immersed in an aqueous solution of 1.25% HF for about 25 seconds, rinsed with water, dried and set in the epitaxial growth apparatus.

Further, supply of a slight amount of atoms constituting a film or a source gas also has an effect of accelerating removal of oxides and suppressing generation of crystal defects due to oxides.

That is, according to the present invention, the following was found. In the present invention, a heat treatment before epitaxial growth in which the etched thickness of monocrystalline silicon is very small is executed under a condition of controlling the Haze value of a porous silicon surface within 4 times, more preferably 2 times as large as that before the heat treatment, whereby the stacking fault density of a non-porous monocrystalline silicon layer formed on a porous layer can be reduced to smaller than $1000/cm^2$, further to $100/cm^2$. Further, by supplying a slight amount of a silicon raw material to a growth surface at the initial growth stage of non-porous monocrystalline silicon, the effect of the present invention of reducing crystal defects can be further improved. Furthermore, the present invention provides a method of controlling the Haze value which is obtained by irradiating a substrate surface with a laser light of a commercially available particle-inspecting apparatus and detecting the DC level of a scattered light with a scattered light intensity measuring apparatus, whereby a process condition can be simply controlled in a non-destructive manner to suppress the crystal defect density to $1000/cm^2$ or less, more preferably $100/cm^2$ or less.

As shown in FIG. 4, the present invention can make lower a heat treatment temperature particularly before sealing surface pores, as compared with the conventional step of epitaxial growth on a porous layer, and therefore it can suppress the agglomeration, enlargement and division of pores in a porous layer, thereby not degrading the selectivity of selective etching of a porous layer in a subsequent step of ELTRAN (trademark) method. That is, according to the present invention, in removal of a porous layer, the crystallinity of a non-porous monocrystalline silicon layer can be improved without generating residues. Further, according to the present invention, in the FIPOS method, there is no degradation of oxidation rate of selective oxidation of a porous layer.

The present inventor executed the following experiment in order to search a correlation between a stacking fault density and a pressure during pre-bake.

A boron-doped (100) Si wafer of a resistivity of 0.013–0.017 Ωcm was provided as a sample. A porous layer was formed under anodization conditions, i.e., in a mixed solution of 49% HF and ethanol at a mixture ratio of 1:1 while a current of 8 mA/cm² was supplied for 11 minutes. The formed porous layer had a porosity of about 20%.

The porous layer was immersed in 1.25% HF solution for 25 seconds, rinsed with water and dried. Then, it was subjected to a heat treatment of 400° C. in an oxygen atmosphere for one hour, immersed in 1.25% HF solution for only a time when an etched thickness of about 5 nm was obtained in the case of silicon oxide, rinsed with water and dried.

Figure 11:
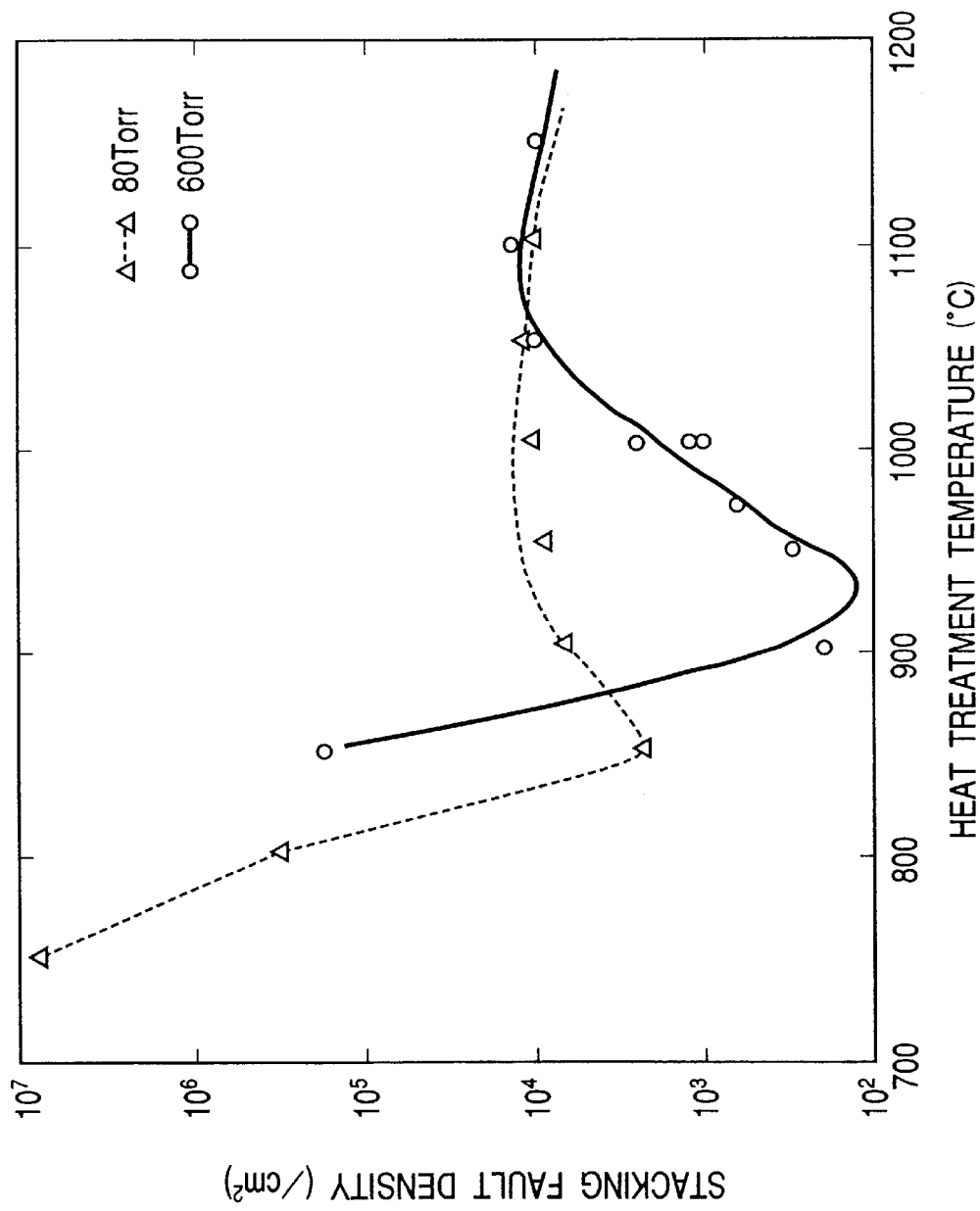
FIG. 11 is a graph explaining different relationships between heat treatment temperature and stacking fault density at different pressures in heat treatment.

Next, epitaxial growth on a porous layer was executed in a reaction vessel provided with a load-lock chamber as an epitaxial growth apparatus. First, the sample was subjected to a heat treatment for 120 seconds in a hydrogen atmosphere under 800 Torr or 600 Torr. Then, $SiH_4$ gas was added to a hydrogen carrier gas so that the concentration of $SiH_4$ gas was 28 ppm, and the sample was treated with this mixture of gases for 120 seconds. After the SiH$_4$ gas treatment was completed, the pressure and the temperature were lowered to 80 Torr and 900° C., respectively, to form an epitaxial layer having a thickness of 2 μm. The stacking fault density at each heat temperature was measured. The measurement result is shown in FIG. 11. From FIG. 11, it was found that the pressure gave a serious influence to the modification of pore structure and surface diffusion of silicon atoms on the porous silicon surface, and that as the pressure became lower, the decrease of the stacking fault density was generated at a lower temperature.

Figure 12:
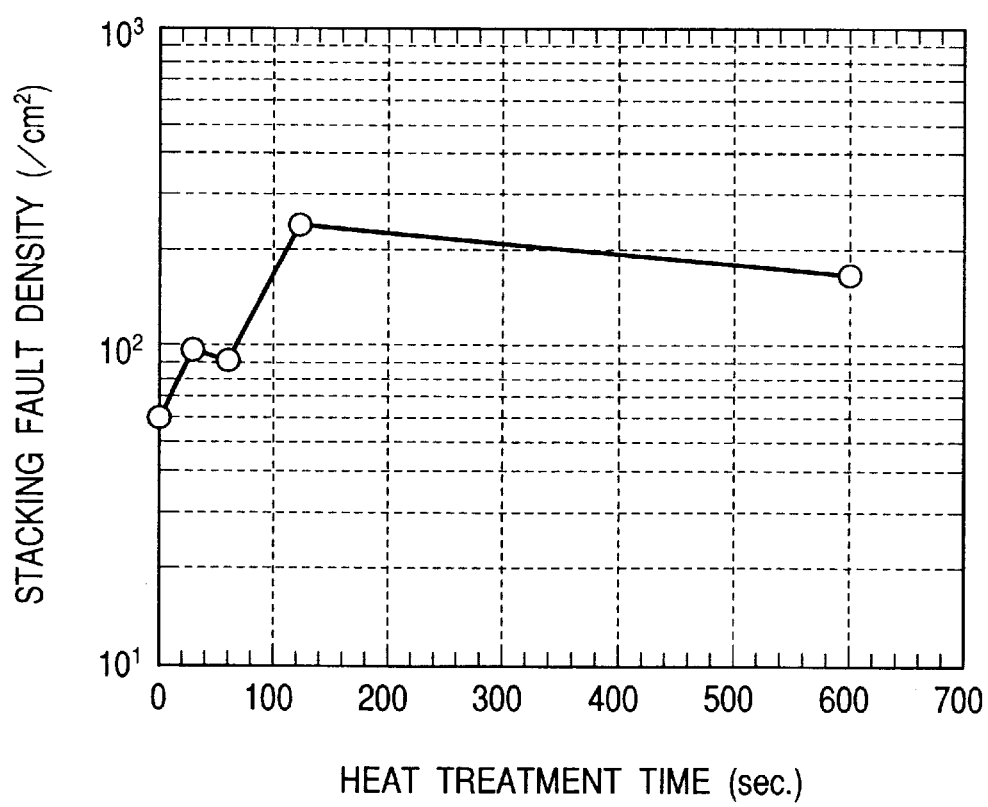
FIG. 12 is a graph explaining a relationship between heat treatment time and stacking fault density.

FIG. 12 shows the dependency of a stacking fault density of a sample produced similarly to the case of FIG. 11 on a heat treatment time for heat-treating the sample before growth at 950° C. under 600 Torr in a hydrogen atmosphere. From FIG. 12, it was found that the stacking fault density in the case of the heat treatment time exceeding 120 seconds became 2 times as large as the case of the heat treatment time of 60 seconds or less.

(Embodiment 1)

FIG. 13A shows one example of a system for determining conditions for suitably executing the pre-bake treatment of a porous layer. This is based on the correlation between the stacking fault density and the change of Haze values before and after pre-bake, as clearly seen from the above-mentioned Experiment 3.

After formation of a porous layer, the Haze value of a porous layer immediately before pre-bake is measured (this measured Haze value is expressed as $d_0$). Then, a pre-bake treatment is executed and the Haze value is also measured (this measured Haze value is expressed as $d_1$). Next, the ratio of change r of the Haze values is evaluated. Concretely, r (=$d_0/d_1$) is obtained and if the obtained r is in a range of $1 \leq r \leq 3.5$, the epitaxial growth step and subsequent steps are executed without changing the pre-bake treatment conditions. However, if the obtained r is in a range of r>3.5, the pre-bake treatment conditions are changed and then conditions for satisfying the relationship of $1 \leq r \leq 3.5$ are determined. Concretely, the temperature and the time are changed or the pre-bake treatment is executed to decrease water and oxygen in the apparatus.

It is not necessary to execute the above evaluation on all the fed silicon wafers, and it is sufficient to evaluate one or several sheets per several to several hundred sheets. In particular, in a new apparatus, it is effective to execute the above evaluation after a test for determining process conditions, modification and repair of the apparatus, cleaning of a reaction vessel and the like. When an obtained semiconductor substrate has an abnormal quality, the evaluation method of the present invention makes it possible to speedy search a cause thereof.

When the pre-bake treatment conditions can be evaluated by the Haze value $d_1$ after the pre-bake treatment itself, the measurement of the value $d_0$ may be omitted.

FIG. 13B shows a flowchart illustrating a system for producing a desired semiconductor substrate by conducting a pre-bake treatment based on determined conditions. Off course, before the epitaxial growth step, it is preferable to measure the Haze value and confirm whether the pre-bake is suitably conducted.

(Embodiment 2)

FIGS. 14A to 14E show a method of forming a semiconductor substrate according to the present invention.

Figure 14A:
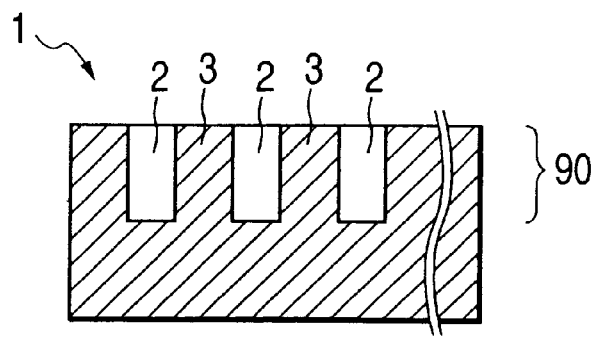
FIGS. 14A, 14B, 14C, 14D and 14E are schematic views illustrating the steps according to the present invention.

As shown in FIG. 14A, a substrate 1 is provided which has a porous silicon layer 90 at least on a free surface side thereof.

Figure 14B:
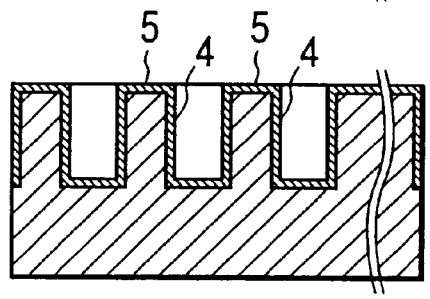

Next, if necessary, as shown in FIG. 14B, a thin protective film 4 is formed on the pore walls 3 of the porous monocrystalline silicon layer (pre-oxidation step).

Figure 14C:
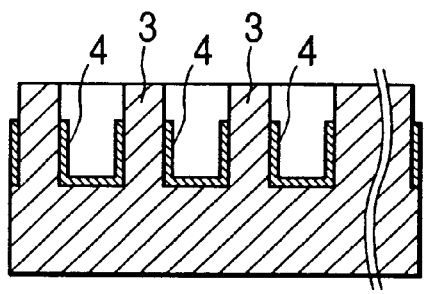

Since this pre-oxidation step causes a protective film 5 such as a silicon oxide film to be formed on the porous silicon layer surface, this substrate is dipped in a low-concentration HF aqueous solution to remove the protective film on the porous silicon surface (hereinafter referred to as "HF dip step"). FIG. 14C is a cross-sectional view showing the removed state schematically.

Figure 14D:
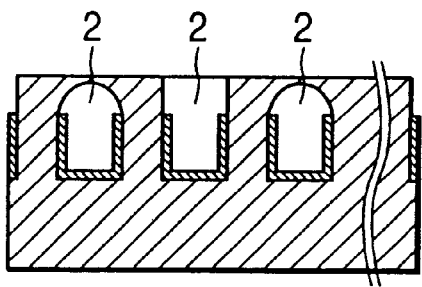
Figure 14E:
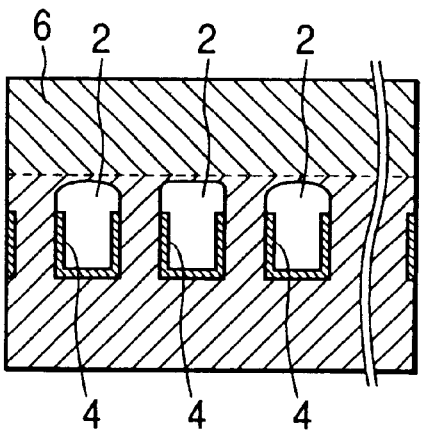

Next, the substrate having the porous monocrystalline silicon formed therein is placed in an epitaxial growth apparatus and heat-treated as shown in FIG. 14D (pre-bake), and a non-porous monocrystalline layer 6 is then formed thereon as shown in FIG. 14E.

The conditions during the pre-bake are such that they satisfy both the conditions 1 under which the etched thickness $t_e$ of the porous silicon layer, i.e. the decrease in the thickness (t) of the porous silicon layer is 2 nm or less, preferably 1 nm or less and the conditions 2 under which the rate of change (r) in the Haze value of the porous silicon layer is $r \leq 3.5$, preferably $r \leq 2$.

The etched thickness $t_e$ can be expressed as $t_e=t_0-t_1$, wherein $t_0$ is the layer thickness of the porous silicon layer before the initiation of the heat teatment and $t_1$ is the layer thickness of the porous silicon layer after the completion of the heat treatment. The rate of change (r) in the Haze value can be expressed as follows:

$$r=d_1/d_0,$$

wherein, $d_0$ is the Haze value before the heat treatment and $d_1$ is the Haze value after the heat treatment.

Moreover, the atmosphere employed for this heat treatment is preferably one as not containing a silicon-based gas, more preferably a reducing atmosphere comprising hydrogen gas. The atmoshere may be an inert gas atmosphere or an ultra-high vacuum.

The following will describe this heat treatment.

(1) Putting Into Apparatus

The substrate having a porous silicon layer formed in its surface is put into the reaction chamber (not shown) in which the residual oxygen amount and water amount are suppressed. Heat treatment employed in the present invention may be functionally divided into two steps of a temperature rise step and a native oxide film removal step. Note here that a native oxide film referred to here means a silicon oxide film unintentionally formed on the surface of the porous silicon layer during the steps subsequent to the HF dip step or an oxide film not removed in the HF dip step.

Suppressing the etched thickness is accomplished by controlling the amounts of the residual oxygen and water in the reaction chamber in the temperature rise step and the native oxide film removal step. The suppression of the residual oxygen and water in the reaction chamber can effectively be attained by suppressing the amounts of oxygen and water contained in the supply gas system and further by carrying the substrate in or out of the reaction chamber through a load-lock chamber, thus preventing the inside of the reaction chamber from being brought into direct contact with the atmosphere.

Also, it is effective to, as the occasion demands, place a purifier for hydrogen as a carrier gas near the apparatus. Also, it is desirable to improve the air-tightness of the supply line and the chamber. By controlling these, it is possible, as mentioned above, to control the etched thickness of the porous silicon layer to 2 nm or less, preferably 1 nm or less during the two steps of the temperature rise step and the native oxygen film removal step. The method for suppressing the etched thickness, however, is not limited to the above-mentioned.

(2) Temperature Rise Step The substrate with the porous silicon layer formed on its surface, after being placed in the reaction chamber, is heated. When the reaction chamber is formed of a light transmissive material such as quartz, the substrate is heated by irradiation with an infrared lamp outside the reaction chamber. Besides the heating with an infrared lamp, induction heating using high frequency, resistance heating, etc, may be employed. Also besides quartz, the reaction chamber may be formed of stainless steel or the like. The larger the temperature rise rate, the more effectively the oxidation/etching due to the residual oxygen and water can be suppressed. The temperature rise rate is preferably 1° C./sec or larger, more preferably 5° C./sec or larger.

When a substrate is carried into the reaction chamber not through a load-lock chamber, the reaction chamber, after the carrying in, is purged sufficiently and, after removing oxygen and water contaminated into the chamber, the substrate is heated to effect temperature rise. However, it is desired to conduct this treatment in an ultra-high vacuum or non-oxidizing atmosphere.

(3) Native Oxide Film Removal Step

Following the temperature rise step, the native oxide film removal step is carried out. That is, a native oxide film is removed by the heat treatment in a hydrogen atmosphere, a hydrogen-containing reducing atmosphere, or ultra-high vacuum. In this case, the rate of change r of the Haze value of the porous silicon layer is 3.5 or less, preferably 2 or less. Note here that the value of r is 1 or more.

To implement the above conditions, the attainable temperature during the heat treatment is not less than 850° C. and not more than 1000° C., preferably not less than 870° C. and not more than 970° C.

The pressure, although not particularly restricted, is the atmospheric pressure or less, preferably 700 Torr or less, more preferably 100 Torr or less.

The heat treatment time except for the temperature rise step is 100 seconds or less, preferably 60 seconds or less, more preferably 10 seconds or less, and it is preferable to lower the temperature immediately after that time has elapsed. Anyway, the pre-bake time should preferably be as short as possible so long as a native oxide film can be removed.

Since a native oxide film is eliminated into the gas phase by the reaction of $SiO_2+Si\rightarrow 2\ SiO\uparrow$, if the thickness of the native oxide film is too large, silicon in and near the porous silicon layer surface is etched.

A native oxide film is formed during rinsing after the HF dip step, in the air until being placed into an epitaxial growth apparatus after being rinsed and dried, during being placed into the epitaxial growth apparatus, and during the temperature rise step. If, in particular, water and oxygen contents remain in the temperature rise step, silicon is oxidized with temperature rise to form a silicon oxide film. As a result, the thus formed silicon oxide reacts with neighboring silicon to etch it.

Also, the thicker the silicon oxide film formed during the temperature rise, the longer the heat treatment time required to completely remove the formed silicon oxide film. If the heat treatment time is thus elongated, the structural change of the porous silicon surface will proceed as described below, which is not desirable.

According to the present invention, the etched thickness should be at most 2 nm or less, preferably 1 nm or less. The less etched thickness of silicon means that the degree of silicon oxidation in the apparatus is small.

If this heat treatment continues, the migration of surface atoms takes place in order to smooth a minute unevenness in the porous silicon surface thereby to reduce the surface energy, thus eliminating most of the surface pores.

A silicon wafer having a porous layer formed thereon was set through a load-lock chamber on a susceptor formed by coating carbon with CVD-SiC in a CVD epitaxial growth apparatus provided with a load-lock chamber in which the susceptor was previously heated to 750° C. in a reaction vessel. Then, the inside of the reaction vessel was set under 600 Torr in a hydrogen atmosphere of hydrogen at a flow rate of 43 liter/min. The inside temperature was increased at a rate of 100° C./min. up to 1100° C., kept at 1100° C. for 2 seconds and decreased at a rate of 100° C./min. to 750° C., and the wafer was taken out from the apparatus through the load-lock chamber. The surface pores of the porous layer after the heat treatment had a decreased pore density of $10^6/cm^2$ and an increased pore size of 20–40 nm in comparison with the wafer before the heat treatment having an average diameter of about 10 nm and a pore density of $10^{11}/cm^2$. After the heat treatment under the above-mentioned conditions, a monocrystalline silicon layer was epitaxially grown by using a silicon source gas added to hydrogen gas, whereby its stacking fault density became $10^4/cm^2$. In the case of heat treatment where the temperature was 1110° C. in place of 950° C. and the holding time was the same as 2 seconds, the pore density after the heat treatment was decreased by at most one order, and the pore size did not increase at all. After this heat treatment, a monocrystalline silicon layer was epitaxially grown by using a silicon source gas added to hydrogen gas, whereby the stacking fault density remarkably decreased to $10^2/cm^2$ which was 1/100 times as that in the case of 1100° C.

By a stress acting between porous silicon and a non-porous monocrystalline silicon substrate, the crystal lattice of the surface of porous silicon is distorted. However, it is considered that in the case the pore density increases, the distortion is concentrated around residual pores and therefore crystal defects are likely to be introduced into the residual pore portions.

According to the present invention, by starting supply of a silicon source gas to a porous silicon surface before the residual pores are decreased by the heat treatment for removal of a native oxide film, the concentration of distortion to the residual pore portions due to the decrease of the pore density is prevented to suppress introduction of crystal defects. The present invention can be executed by a step of increasing a temperature and removing a native oxide film in which the etched thickness of silicon is remarkably small.

The present invention provides a method of controlling the Haze value obtained from the DC level of a scattered light by using a commercially available particle-inspecting apparatus in which a substrate surface is irradiated with a laser light and a scattered light intensity is measured. According to the present method, it is possible to simply and easily control process conditions in a non-destructive manner and control the crystal defect density in a range of $1000/cm^2$ or less, more preferably $100/cm^2$ or less.

The removal of a native oxide film may be executed by using HF gas or by employing other methods, if the etched thickness of silicon is controlled within the above-mentioned range.

The temperature rise step and the native oxide film removal step of the present invention require the control of silicon etching and no formation of a coating film on a porous surface by a heat treatment. Though these steps are not limited particularly in other points, it is preferable that these steps are conducted in ultra-vacuum or hydrogen atmosphere.

(4) Measurement of Haze Value

The measurement of the Haze value is executed by measuring a scattered light intensity generated when a substrate surface is irradiated with a parallel light such as of a laser light or the like. By using a commercially available particle-inspecting apparatus utilizing a laser light, the measurement can be simply and easily executed. As a wavelength of the laser light, a short wavelength such as of 488 nm of Ar laser is preferably used. As the wavelength becomes shorter, the path of entering into a porous layer is shorter, and therefore it is possible to sharply detect the structural change near the surface of a porous layer which directly affects the crystallinity of an epitaxially grown layer. Sharp measurement of the structural change near the surface can be executed by making an incident angle of light larger, that is, by making an angle of light with respect to a substrate surface smaller, thereby shortening a path of entering into a porus layer.

(5) Epitaxial Growth

After the heat treatment step (pre-bake step), a source gas is supplied to seal the pores of the porous member and to form a non-porous monocrystalline layer to a desired film thickness. Thus, it is possible to form on porous silicon a non-porous monocrystalline layer with a reduced stacking fault density.

The non-porous monocrystalline layer may be of homoepitaxially grown silicon, heteroepitaxially grown SiGe, SiC, GaAs, InP, AlGaAs, etc.

(Porous Silicon Layer)

The porous silicon used in the present invention is essentially the same as that studied up to now since being discovered by Uhlir et al. in 1964 and is produced by the anodization method, etc., but not restricted in terms of the substrate impurities, face orientation, production method, etc. as far as it is porous silicon.

When a porous silicon layer is formed by the anodization method, the anodizing solution is an aqueous solution containing hydrofluoric acid as the main component. Since gases generally tend to adhere to the surfaces of electrodes or silicon during anodization to make the porous layer non-uniform, generally alcohol such as ethanol is added to enlarge the contact angle thereby to enhance the removal of the adhering bubbles, thus allowing the anodization to occur uniformly. Of course, even without alcohol, the porous substance is formed. When the porous silicon according to the present invention is used in the FIPOS method, a porosity of about 56% is suited and if it is used in the bonding method, a lower porosity of about 50% or less, preferably 30% or less is suited, although not restricted thereto.

Since the porous silicon layer is formed by etching as described above, the relevant surface has, besides pores penetrating deep into the porous substance, such shallow pores as to be expressed as shallow unevenness such that they can be observed with a field emission type scanning electron microscope (FESEM). A less porosity (t) of the porous silicon results in a less stacking fault density of the porous substance. Porous silicon with a low porosity can be formed by, for example, enhancing the HF concentration, decreasing the current density, or increasing the temperature at time of anodization.

Also, the porous monocrystalline silicon layer may be made by making porous only a main surface layer of a silicon substrate or the entire silicon substrate.

(Pre-oxidation)

In the present invention, as the occasion demands, a protective film is formed on the pore walls of the porous silicon layer. Since the wall between adjacent pores of the porous silicon is as extremely thin as several nm to some tens nm, adjacent pores of the porous layer may be agglomerated, coarsened, or even discontinued by the heat treatment during the epitaxial growth or the thermal oxidation of the epitaxially grown layer, or after the bonding. The agglomeration and coarsening phenomenon of the pores of the porous layer may lead to decrease in the selective etch rate and degradation of etch selectivity. In the case of FIPOS, the increase in the pore wall thickness and the discontinuing of the pores inhibit the proceeding of the porous layer oxidation, thus making it difficult to completely oxidize the porous layers. To guard against this, thermal oxidation or the like method is conducted after the porous layer is formed, to form a thin protective film at the pore walls beforehand, thus suppressing the agglomeration and coarsening of the pores. When forming the protective layer, especially in the case of using the oxidation, it is essential to leave a monocrystalline silicon region inside the pore walls. Therefore, it is enough to provide a film thickness of several nm.

Note here that if, when SOI substrates are produced by the bonding method, the post-steps subsequent to the heat treatment after the bonding are carried out at a sufficiently low temperature to suppress the structural change of the porous substance, this step can be omitted.

(HF Dip)

The porous silicon layer subjected to the abovementioned pre-oxidation may be subjected to the HF dip treatment.

As to the HF dip treatment, Sato et al., (N. Sato, K. Sakaguchi, K. Yamagata, Y. Fujiyama, and T. Yonehara, Proc. of the Seventh Int. Symp. on Silicon Mater. Sci. and Tech., Semiconductor Silicon, (Pennington, The Electrochem. Soc. Inc., 1994), p. 443) report that by elongating the HF dip treatment time, the stacking fault density can be reduced to about $10^3/cm^2$.

Also, when the HF dip treatment is carried out for a long time as described above, some annealing temperatures employed after the bonding may cause the proceeding of the structural coarsening of the porous layers, thus leaving some portions not etched (etch residue) after the etching of the porous silicon, so that it is desirable to control the HF dip time within an appropriate range.

After the HF dip treatment, rinsing and drying can be carried out to decrease the residual HF concentration in the pores of the porous substance (sealing of pores occurs by the supply of a slight amount of a source gas).

According to the present invention, it is desirable to use a silicon-based gas such as $SiH_2Cl_2$, $SiH_4$, $SiHCl_3$, $SiCl_4$, etc. at the initial growth stage of sealing the pores of the porous substance and to set the flow rate of the source gas in such a way as to give a growth rate of 20 nm/min or less, preferably 10 nm/min or less, more preferably 2 nm/min or less. This further reduces the crystal defects. In the case of the MBE method or the like where silicon is supplied from a solid source and the substrate temperature is as low as 800° C. or less, the growth rate is preferably 0.1 nm/min or less. After the sealing of pores is completed by the step of supplying a slight amount of a source gas, which is also referred to as "pre-injection step", the growth rate is not limited in particular.

It may be carried out under the same conditions as those for the growth on ordinary bulk silicon. Otherwise, the growth may be continued at the same growth rate as that for the above-mentioned step of supplying a slight amount of a source gas or the gas species may be changed, which does not depart from the scope of the invention. Also, the step following the step of supplying a slight amount of a source gas may be a step of once stopping the supply of a source gas and then supplying a desired source gas to continue the growth. In N. Sato et al., Jpn. J. Appl. Phys. 35 (1996) 973 is reported that as compared to the conventional methods, the stacking fault density can be reduced by decreasing the supply rate of the slight amount of $SiH_2Cl_2$ at the initial stage of the growth. However, such a method is the same as the conventional ones in a respect that the stacking fault density is reduced by increasing the temperature of pre-bake before expitaxial growth and sometimes results in occurrence of etch residue by the coarsening of the porous layer structure as mentioned above. The present invention makes it possible to perform the heat treatment before the growth at about 950° C., which is lower than the conventional temperatures, thus suppressing coarsening of the porous structure.

According to the present embodiment, it is possible to avoid the heat treatment at high temperatures employed in the conventional methods, by a substrate having a porous silicon layer in an apparatus in which silicon is etched in a less amount, to control the heat treatment time before the growth. With this, the crystalline defect density can be reduced, thus enabling it to suppress the coarsening of the porous structure and the discontinuing of the pores.

Further, since it is possible to control the growth temperature, pressure, gas flow rate, etc. independently of the above-mentioned initial growth step, the treatment temperature may be decreased to suppress the coarsening of the porous silicon structure, the auto-doping of such impurities as boron, phosphorus, etc. from porous silicon, or the solid-phase diffusion, or the growth temperature and the flow rate of a silicon source gas may be increased to accelerate the growth rate, thus forming a thick non-porous monocrystalline silicon layer in a short lapse of time.

Moreover, the non-porous monocrystalline layer to be grown is, as mentioned earlier, not limited to silicon, but may be of a Group IV type heteroepitaxy material such as SiGe, SiC, etc. or such a compound semiconductor as those represented by GaAs. Also, it is within the scope of the invention to use a silicon-based gas in the above-mentioned step of supplying a slight amount of a source gas and then to use another gas to perform heteroepitaxial growth.

Further, it is also preferred that after the step of sealing the pores of the porous layer surface (i.e., the pre-bake/pre-injection steps) and before the growth of a desired film, the substrate is heat-treated at a temperature higher than the temperatures of the pre-bake/pre-injection in an atmosphere not containing any source gas of the semiconductor film (for example, a reducing atmosphere comprising hydrogen). This heat treatment is referred to as "inter baking".

(Embodiment 3)

The following describes with reference to FIG. 10 an example of producing a semiconductor substrate having a non-porous monocrystalline silicon layer with a low stacking fault density on a porous monocrystalline silicon layer.

Figure 15A:
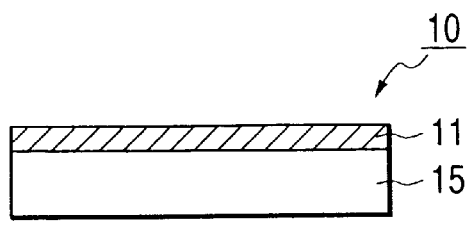

A substrate 10 having a porous silicon layer 11 is produced by making porous entirely or partially at least one surface side of a monocrystalline silicon base member (FIG. 15A).

Figure 15B:
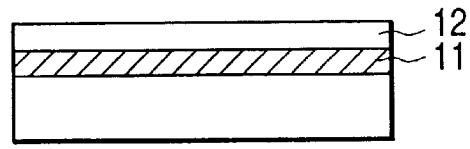
Figure 15C:
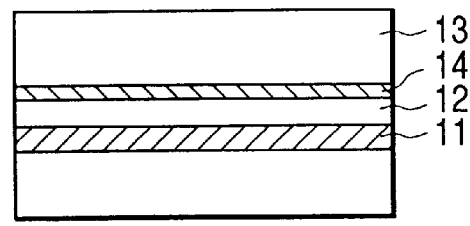

Almost the same heat treatment (pre-bake) as given in Embodiment 2 is performed, i.e. treatment in which silicon is etched as much as 2 nm or less, preferably 1 nm or less and the rate of change r of the Haze value of the porous silicon layer is 3.5 or less, preferably 2 or less (FIG. 15B). Then, a non-porous monocrystalline layer 12 is formed on the porous monocrystalline silicon layer (FIG. 15C).

In this case, the above-mentioned pre-oxidation or HF dip can be performed prior to the heat treatment. Also, it is desirable to, after the heat treatment, conduct the supply of a slight amount of a source gas (pre-injection) to carry out the pore sealing step.

Figure 15D:
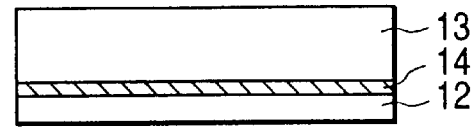

Next, the bonding method is used to produce an SOI substrate, in such a way that an insulator layer is first formed on a main surface of at least one of the non-porous monocrystalline silicon and a second substrate and then, they are bonded to each other so as to locate the non-porous monocrystalline layer at the inside, thus forming a multi-layer structure member (FIG. 15D). Then, as occasion demands, heat treatment is performed to enhance the bonding strength, and then the removal step by selective etching or the like of the porous silicon is carried out (FIG. 15E) to transfer the epitaxially grown layer on the porous silicon onto the second substrate, thus obtaining the SOI structure.

If the thus obtained bonding strength is strong enough to withstand the subsequent steps, the process proceeds to the subsequent steps. A mechanical method such as grinding or a chemical method such as etching is performed to remove the back side of the substrate on which the porous layer has been formed, to expose the porous layer. Alternatively, the portion 15 not made porous of the substrate 10 having a multilayered structure may be separated at the porous layer to expose the porous layer. The separation may be carried out mechanically by inserting a wedge, etc. into the substrate from the edge surface or spraying a fluid as in a water Jet or may be carried out utilizing ultrasonic waves or thermal stress. It is desirable to make it easy to separate the portion by beforehand forming partially a highly porous sublayer with a low mechanical strength in the porous layer. For example, the porous layer 11 may be constituted of a first porous layer having a porosity of 10 to 30% which is provided under a non-porous monocrystalline layer 12, and a second porous layer having a porosity of 30 to 70% which is provided under the first porous layer.

(Selective Etching of Porous Substance)

The porous layer remaining on the non-porous monocrystalline layer 12 is removed by selective etching. Preferably, the selective etchant is a mixture liquid of HF, $H_2O_2$, and $H_2O$. To remove bubbles generated during the reaction, ethyl alcohol, isopropyl alcohol, or a surfactant may be added to the mixture liquid.

The present method suppresses the structural change and coarsening of the porous layer and the discontinuing of pores, thus reducing the degradation of selectivity in selective etching.

Note here that there is no particular limitation to the second substrate to which is bonded the non-porous monocrystalline silicon layer formed on the porous silicon, so long as it has such smoothness that it can be in close contact with the surface of the non-porous monocrystalline silicon or of a film formed thereon. For example, there can be used a silicon wafer, a silicon wafer having a thermally oxidized silicon film formed thereof, a transparent substrate such as a quartz wafer, a sapphire wafer, or the like. When it is to be bonded to an insulating substrate, the insulating layer 14 can be omitted.

Also, the non-porous monocrystalline silicon layer can be bonded as such to the second substrate, or otherwise may first be subjected to formation of a film thereon and then be bonded to the second substrate. The film to be formed may be a film of silicon oxide or silicon nitride, or a monocrystalline film of SiGe, SiC, or a Group III-V compound, or a Group II-VI compound, or may be a stack thereof.

It is preferable to rinse cleanly the bonding surfaces before the bonding. The rinsing step may be of a prior one which is used in the conventional semiconductor processes. Also, the bonding strength can be improved by irradiating them with nitrogen plasma etc. before bonding.

After the bonding, heat treatment is preferably carried out to enhance the bonding strength.

(Hydrogen Annealing)

After the porous silicon is removed, the non-porous monocrystalline layer 12 has unevenness which reflects the period between the pores and side walls of the porous silicon which were present on the surface. This surface corresponds to the interface between the non-porous monocrystalline silicon and the porous silicon, both of which are of monocrystalline silicon with only a difference of whether they have pores or not. The unevenness in the surface can be removed by polishing or the like and, when subjected to heat treatment in a hydrogen atmosphere (referred to as "hydrogen annealing"), can be removed substantially without reducing the thickness of the non-porous monocrystalline silicon film. The hydrogen annealing can be performed at atmospheric pressure, a high pressure, a reduced pressure, or a slightly reduced pressure. Also, the temperature is from 800° C. to the melting point of silicon, preferably 900° C. to 1350° C.

(Boron Concentration Control)

Although, on the other hand, crystal growth of an epitaxial layer on a porous silicon layer is much better in the case of making $p^+Si$ ($^-0.01\Omega$–cm boron doped) porous than in the case of anodizing $p^-Si$($^-0.01\Omega$cm boron doped), there is a case where the high-concentration boron is auto-doped or solid-phase diffused during the epitaxial growth into the epitaxial silicon layer. The boron diffused into the epitaxial silicon layer may remain after the porous silicon is removed, bringing about troubles in control of the impurity concentration of active layers in SOI. To solve this problem, Sato et al. proposed such a method (N. Sato and T. Yonehara, Appl. Phys. Lett. 65 (1994), p. 1924) that an SOI structure completed substrate is annealed in hydrogen to remove a native oxide film on the SOI layer surface with a low boron diffusion speed and the boron in the SOI layer are diffused outside to attain a low boron concentration. However, an excessive diffusion of boron into the epitaxial silicon layer may cause the incorporation of boron into a buried oxide film as well as the elongation of hydrogen annealing time, thus resulting in an increase in the process cost, or lowering in controllability of the boron concentration in the buried oxide film. To solve this problem, it is effective to form the epitaxial silicon layer at a lower temperature to suppress the diffusion of boron. According to the present invention, it is possible to set appropriate conditions for the formation of the epitaxial silicon layer because they can be set independently of the sealing of the pores.

(FIPOS Method)

Also, instead of the bonding method, the FIPOS method may be used to remove partially the epitaxially grown layer and then selectively oxidize porous silicon by the oxidation treatment to thereby form an SOI structure. The present method suppresses the structural change and coarsening of the porous layer and the discontinuing of pores, thus reducing the degradation in selectivity in the selective oxidation.

(Heteroepitaxy)

On the porous silicon layer, besides silicon, a non-porous monocrystalline layer made of GaAs or another compound semiconductor or a Group IV type material such as SiC, SiGe, etc. may be heteroepitaxially grown. In heteroepitaxy, the porous silicon acts as a stress relaxation material, thus relaxing stress due to lattice mismatching and, moreover, reducing the crystal defect density of the non-porous monocrystalline silicon layer to reduce also the defect density of the heteroepitaxially grown layer. The present method suppresses the structural change and coarsening of the porous layer and the discontinuing of pores, thus reducing the degradation of the stress relaxation effect.

(Other Applications)

Since porous silicon has the gettering action, it is possible to produce substrates having a high impurity tolerance against metal contamination etc. during processes by, instead of forming the SOI structure as mentioned above, directly forming MOS transistors and bipolar transistors in the non-porous monocrystalline silicon layers produced by the present invention.

Since the present method, as compared to the conventional ones, can be lower the heat treatment temperature, especially that before the sealing of pores, it is possible to suppress the agglomeration, expansion, and discontinuity of pores in the porous layers, thus preventing the degradation of the selectivity in selective etching of the porous layer in the steps subsequent to the bonding step. That is, it is possible to improve the crystallinity of the non-porous monocrystalline silicon layer without generating etch residue in the removal of the porous layer. Also, the FIPOS method does not degrade the rate of selectively oxidizing the porous layer.

The following will describe the specific examples of the present invention.

EXAMPLE 1

950° C., 600 Torr. Pre-bake (2 seconds, 120 Seconds), Pre-injection, Epi-2 $\mu$m 1) Boron was added as a p-type impurity, to provide CZ6-inch (100) $p^+$ silicon wafers with a resistivity of 0.015$\Omega$cm+/–0.005$\Omega$cm.

2) In a solution in which 49% HF and ethyl alcohol were mixed at a ratio of 2:1, the above-mentioned silicon wafer was disposed as the anode and a 6-inch-diameter platinum plate was disposed as the cathode in opposition to the silicon wafer. The back side of the silicon wafer was made in opposition to a surface side of another $p^+$ silicon wafer with the same solution therebetween, thus permitting the most distant wafer to face a 6-inch-diameter platinum plate. The respective solutions between the wafers were separated from each other, thus preventing electrical conduction therebetween. Between the above-mentioned silicon wafer and the platinum plate was flown a current at a current density of 10 mA/cm$^2$ for 12 minutes to anodize the silicon wafers, thus forming a porous silicon layer of 12 $\mu$m thickness on each surface.

3) Subsequently, each wafer on which a porous silicon layer was thus formed was subjected to oxidization at 400° C. in an oxygen atmosphere for 1 hour. Since this oxidation treatment provided only about 50 Å or less thickness of an oxide film, the silicon oxide film was formed only on the porous silicon surface and the pore side walls, leaving a monocrystalline silicon region inside of the wafer.

4) The above-mentioned wafers were dipped in an HF aqueous solution diluted to 1.25% for 30 seconds and then in pure water for 10 minutes for overflow rinsing, to remove the ultra-thin silicon oxide film formed on the porous layer surface.

5) Then, as the pre-bake step, a heat treatment of 1100° C. for 120 seconds was conducted. The Haze value immediately before the pre-bake was 9.1 ppm, the Haze value after the pre-bake was 34.5 ppm and the obtained r was 3.8 (>3.5). Further, the heat treatment was conducted under various conditions such that the rate of change r of the Haze value satisfies the relationship between $1 \leq r \leq 3.5$. As the results, it was found that when the heat treatment of 950° C. for 120 seconds was conducted, the rate of change r was 2.8 (<3.5). After conducting the pre-bake under the condition of r=2.8, in the reaction vessel at 600Torr, $SiH_4$ was added to the hydrogen carrier gas so as to provide a concentration of 28 ppm to thereby treat the wafer for 200 seconds and the addition of $SiH_4$ was stopped. Then the pressure was decreased to 80 Torr and the temperature, down to 900° C., and $SiH_2Cl_2$ was added so as to provide a concentration of 0.5 mol % to thereby form a non-porous monocrystalline silicon film in the thickness of 2 $\mu$m. The treated wafers were etched to reveal crystal defects introduced into the non-porous monocrystalline silicon layer and then observed with a Nomarski differential interference microscope. Thus observed defects had a stacking fault percentage of 99% or more. The stacking fault density was 160/$cm^2$. On the other hand, it was found that when in the case of r=3.8 the epitaxial layer was formed in the same conditions, the stacking fault density was $1.5 \times 10^4$/$cm^2$. From the above, by conducting the pre-bake such that the Haze value is in a predetermined range, it is possible to form a monocrystalline Si layer with a very low stacking fault density.

EXAMPLE 2
950° C., 600 Torr. Pre-bake (2 Seconds, 120 Seconds), Pre-injection, Epi-2 $\mu$m)

1) Boron was added as a p-type impurity, to provide CZ6-inch (100) $p^+$ silicon wafers with a resistivity of 0.015$\Omega$cm+/−0.015$\Omega$cm.

2) In an aqueous solution in which 49% HF and ethyl alcohol were mixed at a ratio of 2:1, the above-mentioned silicon wafer was disposed as the anode and a 6-inch-diameter platinum plate was disposed as the cathode in opposition to the silicon wafer. The back side of the silicon wafer was made in opposition to a surface side of another $p^+$ silicon wafer with the same solution therebetween, thus permitting the most distant wafer to face a 6-inch-diameter platinum plate. The respective solutions between the wafers were separated from each other, thus preventing electrical conduction therebetween. Between the above-mentioned silicon wafer and the platinum plate was flown a current at a current density of 10 mA/$cm^2$ for 12 minutes to anodize the silicon wafers, thus forming a porous silicon layer of 12 $\mu$m thickness on each surface.

3) Subsequently, each wafer on which a porous silicon layer was thus formed was subjected to oxidization at 400° C. in an oxygen atmosphere for 1 hour.

Since this oxidation treatment provided only about 50 Å or less thickness of an oxide film, the silicon oxide film was formed only on the porous silicon surface and the pore side walls, leaving a monocrystalline silicon region inside of the wafer.

4) The above-mentioned wafers were dipped in an HF aqueous solution diluted to 1.25% for 30 seconds and then in pure water for 10 minutes for overflow rinsing, to remove the ultra-thin silicon oxide film formed on the porous layer surface.

5) The above-mentioned wafers, as placed on a wafer carrier, were set in a load-lock chamber of the epitaxial CVD growth apparatus in which the load-lock chamber for setting wafers on the wafer carrier, a transport chamber having a wafer transporting robot, and a process chamber were connected.

The load-lock chamber was evacuated with a dry pump from the atmospheric pressure down to 1 Torr or less and $N_2$ gas was introduced thereinto to make the pressure 80 Torr. The transport chamber is held at 80 Torr with the introduction of $N_2$ gas beforehand. In the process chamber was placed a susceptor which is made of carbon coated with CVD-SiC for holding wafers. The susceptor was heated to about 750° C. by an IR lamp beforehand. A hydrogen purifier using a heated palladium alloy supplied purified hydrogen gas to the process chamber via an about 10-meter long internally polished stainless steel pipe. The wafers were carried by the transport robot from the load-lock chamber via the transport chamber to the process chamber and placed on the susceptor.

6) After the inside of the process chamber was set at a pressure of 600 Torr, the wafers transported on the susceptor was heated with an IR lamp at a rate of 100° C./min up to 950° C. and held at this temperature for 2 seconds and then cooled down to 750° C. and taken out again with the transport robot via the transport chamber to the load-lock chamber. Another wafer was held at 950° C. for 120 seconds and then otherwise subjected to the same treatments as described above and then returned to the load-lock chamber.

7) The load-lock chamber was opened to the atmosphere and the wafers were taken out. The porous layer surfaces were observed with a particle-inspecting apparatus to show that the 2 seconds treated wafer has a Haze value of the porous layer surface of 11.9 ppm and the 120 seconds treated wafer had a Haze value of 25.7 ppm. Since the sample had a Haze value of 9.1 ppm before being placed in the expitaxial growth apparatus, the Haze values after the tratment were about 1.3 times and about 2.8 times as large as those before the treatment, respectively. That is, their rates of change r were 1.3 and 2.8, respectively.

8) Further, SOI substrates provided beforehand were dipped into an HF solution, then cleaned with water and dried, and measured for the film thickness of the SOI layer with an optical interference type film thickness meter and subjected to treatments 5) and 6) above and taken out from the load-lock chamber. The thicknesses of the SOI layers were measured again to find that the film thickness reduced only by less than 1 nm in the both samples.

9) The wafers subjected to treatment 4) above were transported to the process chamber of the epitaxial growth apparatus in the manner as mentioned in 5) above.

10) After the pressure of the process chamber was set at 600 Torr, the wafer transported on the susceptor was heated with an IR lamp at a rate of 100° C./min and subjected to heat treatment (pre-bake treatment) to be held at 950° C. for 2 seconds; then $SiH_4$ was added to the hydrogen carrier gas so as to provide a concentration of 28 ppm to thereby treat the wafer for 200 seconds and the addition of $SiH_4$ was stopped. Then the pressure was decreased to 80 Torr and the temperature, down to 900° C., and $SiH_2Cl_2$ was added so as to provide a concentration of 0.5 mol % to thereby form a non-porous monocrystalline silicon film in the thickness of 2 $\mu$m. Then, the temperature was decreased to 750° C. in the hydrogen atmosphere and the wafer was again taken out with the transport robot via the transport chamber to the load-lock chamber. The other wafer was subjected to the pre-bake treatment at 950° C. in a hydrogen atmosphere for 120 seconds and otherwise underwent the same treatment as described above and returned to the load-lock chamber. Note here that when the $SiH_4$ was added to provide the concentration of 28 ppm, the growth rate was 3.3 nm/min.

11) The wafers as finished of treatment 10) above were etched to reveal crystal defects introduced into the non-porous monocrystalline silicon layer and then observed with a Nomarski differential interference microscope. Thus observed defects had a stacking fault percentage of 99% or more. The stacking fault density was 84/cm$^2$ for the 2 seconds pre-bake and 160/cm$^2$ for the 60 seconds pre-bake, thus being reduced drastically as compared to 1.5×10$^4$/cm$^2$ for the 120-second pre-bake treatment at 1100° C. In particular, for the 2 seconds pre-bake at 950° C., a stacking fault density less than 100/cm$^2$ was obtained.

EXAMPLE 3
950° C., 600 Torr, Pre-bake (2 seconds), Pre-injection, Epi-0.32 μm)

1) CZ8-inch (100) p+ silicon wafers were provided which was obtained by adding boron as a p-type impurity to provide a resistivity of 0.015Ωcm+/−0.01Ωcm.

2) In an aqueous solution of a mixture of 49% HF and ethyl alcohol at a ratio of 2:1, the above-mentioned wafer was disposed as the anode and a 6-inch-diameter platinum plate was disposed as the cathode in opposition to the wafer. The back side of the silicon wafer was made in opposition to a side of another p$^+$ silicon wafer with the same solution therebetween, thus permitting the most distant wafer to face a 6-inch-diameter platinum plate. The respective solutions between the wafers were separated from each other, so as not to be in electrical conduction with each other. Between the silicon wafer and the platinum plate was passed a current having a current density of 10 mA/cm$^2$ for 12 minutes to anodize the silicon wafers so as to form a plurality of the wafers each having a porous silicon layer of a thickness of 12 μm on the surface.

3) Subsequently, each wafer on which a porous silicon layer was formed was subjected to oxidization in an oxygen atmosphere at 400° C. for 1 hour. Since this oxidization treatment provided only about 50 Å or less thickness of an oxide film, the silicon oxide film was formed only on the porous silicon surface and the pore side walls, leaving a monocrystalline silicon region inside of the wafer.

4) The above-mentioned wafers were dipped for 30 seconds in an HF aqueous solution diluted to 1.25% and then in pure water for 10 minutes for overflow rinsing, to remove the ultra-thin silicon oxide film formed on the porous layer surface.

5) The above-mentioned wafers were placed on a wafer carrier and set in a load-lock chamber of the expitaxial CVD-growth apparatus in which the load-lock chamber to set wafers on the wafer carrier, a transport chamber having a wafer transport robot, and a process chamber were connected. The load-lock chamber was evacuated with a dry pump from the atmospheric pressure down to 1 Torr or less, and N$_2$ gas was introduced thereinto to increase the pressure to 80 Torr. The transport chamber was held at 80 Torr by introducing N$_2$ gas beforehand. In the process chamber was placed a susceptor which is made of carbon coated with CVD-SiC for holding wafers. The susceptor was heated with an IR lamp to about 750° C. beforehand. Into the process chamber was supplied purified hydrogen gas from a hydrogen purifier using a heated palladium alloy via an about 10-meter long internally polished stainless steel pipe.

The wafers were carried with the transport robot from the load-lock chamber via the transport chamber to the process chamber and placed onto the susceptor.

6) The wafers thus transported on the susceptor were heated with an IR lamp at a rate of 100° C./min and held at 950° C. for pre-bake for 2 seconds. The conditions at this time were such that the etched thickness of silicon was less than 1 nm and the rate of change r of the Haze value was 1.3.

Next, SiH$_2$Cl$_2$ was added to the hydrogen carrier gas to provide a concentration of 28 ppm to carry out treatment for 200 seconds and addition of SiH$_4$ was stopped, and then the temperature was lowered to 900° C.; and SiH$_2$Cl$_2$ was then added so as to provide a concentration of 0.5 mol % to form non-porous monocrystalline silicon layers as thick as 0.32 μm; then the temperature was lowered to 750° C. in the hydrogen atmosphere and the wafers were taken out again with the transport robot via the transport chamber to the load-lock chamber. The thus formed non-porous monocrystalline silicon layers have an average thickness of 0.32 μm and the maximum value−the minimum value=8 nm.

7) Each wafer on which the non-porous monocrystalline silicon layer was expitaxial-grown was set in a vertical type furnace and subjected to heat treatment at 1000° C. in a mixture gas of water vapor formed by burning oxygen and hydrogen and the remaining oxygen to oxidize the surface of the non-porous monocrystalline silicon to thus form a silicon oxide film with a thickness of 208 nm.

8) Each of the above-mentioned wafer and a second silicon wafer were cleaned in the cleaning line of a silicon semiconductor process and then superposed upon each other gently with their primary main surfaces facing each other and pressed at the middle thereof to integrate them.

9) Subsequently, the thus integrated wafers were set in the vertical type furnace and subjected to heat treatment at 1100° C. in an oxygen atmosphere for 1 hour.

10) The back side of each of the wafers on which the porous silicon was formed was ground with a grinder to expose the porous silicon on the whole wafer surface.

11) The thus exposed porous silicon layers were dipped into a mixture solution of HF and aqueous hydrogen peroxide solution to remove all of the porous silicon in about 2 hours, showing on the whole wafer surface the interference color due to the non-porous monocrystalline silicon layer and the thermally oxidized silicon film.

12) The wafers as finished of treatment 11) above were cleaned in a cleaning line generally used in the silicon semiconductor device process and set in a vertical type hydrogen annealing furnace and subjected to heat treatment in a 100%-hydrogen atmosphere at 1100° C. for 4 hours. The hydrogen gas used was purified by a commercially available hydrogen purifier using a palladium alloy connected to the apparatus via an about 7-meter long stainless steel pipe polished internally.

13) Thus, SOI structure wafers were produced in which a 200 nm thick silicon oxide layer and a 200 nm thick monocrystalline silicon layer were stacked on the second silicon wafer.

The monocrystalline silicon layers had an average thickness of 201 nm and the maximum value−minimum value=8 nm.

The wafers as finished of treatment 13) above were subjected to defect revealing etching to remove the monocrystalline silicon layer by the thickness of 130 nm and then dipped into a 49% HF solution for 3 minutes. As a result, the buried oxide film was etched by the HF through the portions of crystal defects remaining in the monocrystalline silicon layer etched by the defect revealing etching, which could be easily determined for the defect density with a Nomarski differential interference microscope. The thus observed defect density was 64/cm$^2$. The stacking faults introduced into the non-porous monocrystalline silicon layer was found to be reduced by the hydrogen annealing. Thus, thin film SOI layers with a uniform film thickness and a crystal defect density less than 100/cm$^2$ were obtained.

EXAMPLE 4
950° C., 600 Torr, Pre-bake (2 Seconds, 120 Seconds), No Pre-injection, Epi-2 μm 1) Boron was added as a p-type impurity, to provide 6-inch (100) p$^+$ silicon wafers (CZ wafers) with a resistivity of 0.015Ωcm+/−0.005Ωcm.

2) In a solution in which 49% HF and ethyl alcohol were mixed at a ratio of 2:1, the above-mentioned silicon wafer was disposed as the anode and a 6-inch-diameter platinum plate was disposed as the cathode in opposition to the silicon wafer. The back side of the silicon wafer was made in opposition to a surface side of another p$^+$ silicon wafer with the same solution therebetween, thus permitting the most distant wafer to face a 6-inch-diameter platinum plate. The respective solutions between the wafers were separated from each other, thus preventing electrical conduction therebetween. Between the above-mentioned silicon wafer and the platinum plate was passed a current at a current density of 10 mA/cm$^2$ for 12 minutes to anodize the silicon wafers, thus forming a porous silicon layer of 12 $\mu$m thickness on each surface.

3) Subsequently, each wafer on which a porous silicon layer was thus formed was subjected to oxidization at 400° C. in an oxygen atmosphere for 1 hour. Since this oxidation treatment provided only about 50 Å or less thickness of an oxide film, the silicon oxide film was formed only on the porous silicon surface and the pore side walls, leaving a monocrystalline silicon region inside of the wafer.

4) The above-mentioned wafers were dipped in an HF aqueous solution diluted to 1.25% for 30 seconds and then in pure water for 10 minutes for overflow rinsing, to remove the ultra-thin silicon oxide film formed on the porous layer surface.

5) The above-mentioned wafers, as placed on a wafer carrier, were set in a load-lock chamber of the epitaxial CVD growth apparatus in which the load-lock chamber for setting wafers on the wafer carrier, a transport chamber having a wafer transporting robot, and a process chamber were connected. The load-lock chamber was evacuated with a dry pump from the atmospheric pressure down to 1 Torr or less and N$_2$ gas was introduced thereinto to make the pressure 80 Torr.

The transport chamber is held at 80 Torr with the introduction of N$_2$ gas beforehand. In the process chamber was placed a susceptor which is made of carbon coated with CVD-SiC for holding wafers. The susceptor was heated to about 750° C. by an IR lamp beforehand. A hydrogen purifier using a heated palladium alloy supplied purified hydrogen gas to the process chamber via an about 10-meter long internally polished stainless steel pipe.

The wafers were carried by the transport robot from the load-lock chamber via the transport chamber to the process chamber and placed on the susceptor.

6) After the process chamber was set at a pressure of 600 Torr, the wafers transported on the susceptor was heated with an IR lamp at a rate of 100° C./min up to 950° C. and held at this temperature for 2 seconds and then cooled down to 750° C. and taken out again with the transport robot via the transport chamber to the load-lock chamber. Another wafer was held at 950° C. for 60 seconds and then otherwise subjected to the same treatments as described above and then returned to the load-lock chamber.

7) The load-lock chamber was opened to the atmosphere and the wafers were taken out. The porous layer surfaces were measured with a particle-inspecting apparatus to show that the 2 seconds treated wafer has a Haze value of the porous layer surface of 11.9 and the 60 seconds treated wafer had a Haze value of 16.3. Since the sample had a Haze value of 9.1 before being placed in the expitaxial growth apparatus, the Haze values after the treatment were about 1.3 times and about 1.8 times as large as those before the treatment, respectively.

8) Further, SOI substrates provided beforehand were dipped into an HF solution, then cleaned with water and dried, and measured for the film thickness of the SOI layer with an optical interference type film thickness meter and subjected to treatments 5) and 6) above and taken out from the load-lock chamber. The thicknesses of the SOI layers were measured again to find that the film thickness reduced only by less than 1 nm in the both samples.

9) The wafers subjected to treatment 4) above were transported to the process chamber of the epitaxial growth apparatus in the manner as mentioned in 5) above. 10) After the pressure of the process chamber was set at 600 Torr, the wafer transported on the susceptor was heated with an IR lamp at a rate of 100° C./min and subjected to heat treatment to be held at 950° C. for 2 seconds. Then the pressure w as decrease d to 80 Torr and the temperature, down to 900° C., and SiH$_2$Cl$_2$ was added so as to provide a concentration of 0.5 mol % to thereby form a non-porous monocrystalline silicon film of the thickness of 2 $\mu$m. Then, the temperature was decreased to 750° C. in the hydrogen atmosphere and the wafer was again taken out with the transport robot via the transport chamber to the load-lock chamber. The other wafer was subjected to the pre-bake treatment at 950° C. in a hydrogen atmosphere for 120 seconds and otherwise underwent the same treatment as described above and returned to the load-lock chamber.

11) The wafers as finished of treatment 10) above were etched for defect revealing to reveal crystal defects introduced into the non-porous monocrystalline silicon layer and then observed with a Nomarski differential interference microscope. Thus observed defects had a stacking fault percentage of 99% or more. The stacking fault density was 170/cm$^2$ for the 2 seconds pre-bake and 270/cm$^2$ for the 60 seconds pre-bake, thus being reduced drastically as compared to 1.5×10$^4$/cm$^2$ for the 120-second pre-bake treatment at 1100° C.

EXAMPLE 5

900° C., 450 Torr, Pre-bake (2 seconds, 120 seconds), Pre-injection, Epi-2 $\mu$m 1) Box-on was added as a p-type impurity, to provide 6-inch (100) p$^+$ silicon wafers (CZ wafers) with a resistivity of 0.015Ωcm+/−0.005Ωcm.

2) In a solution in which 49% HF and ethyl alcohol were mixed at a ratio of 2:1, the above-mentioned silicon wafer was disposed as the anode and a 6-inch-diameter platinum plate was disposed as the cathode in opposition to the silicon wafer. The back side of the silicon wafer was made in opposition to a surface side of another p$^+$ silicon wafer with the same solution therebetween, thus permitting the most distant wafer to face a 6-inch-diameter platinum plate. The respective solutions between the wafers were separated from each other, thus preventing electrical conduction therebetween. Between the above-mentioned silicon wafer and the platinum plate was passed a current at a current density of 10 mA/cm$^2$ for 12 minutes to anodize the silicon wafers, thus forming a porous silicon layer of 12 $\mu$m thickness on each surface.

3) Subsequently, each wafer on which a porous silicon layer was thus formed was subjected to oxidization at 400° C. in an oxygen atmosphere for 1 hour. Since this oxidation treatment provided only about 50 Å or less thickness of an oxide film, the silicon oxide film was formed only on the porous silicon surface and the pore side walls, leaving a monocrystalline silicon region inside of the wafer.

4) The above-mentioned wafers were dipped in an HF aqueous solution diluted to 1.25% for 30 seconds and then in pure water for 10 minutes for overflow rinsing, to remove the ultra-thin silicon oxide film formed on the porous layer surface.

5) The above-mentioned wafers, as placed on a wafer carrier, were set in a load-lock chamber of the epitaxial CVD growth apparatus in which the load-lock chamber for setting wafers on the wafer carrier, a transport chamber having a wafer transporting robot, and a process chamber were connected. The load-lock chamber was evacuated with a dry pump from the atmospheric pressure down to 1 Torr or less and $N_2$ gas was introduced thereinto to make the pressure 80 Torr. The transport chamber is held at 80 Torr with the introduction of $N_2$ gas beforehand. In the process chamber was placed a susceptor which is made of carbon coated with CVD-SiC for holding wafers. The susceptor was heated to about 750° C. by an IR lamp beforehand. A hydrogen purifier using a heated palladium alloy supplied purified hydrogen gas to the process chamber via an about 10-meter long internally polished stainless steel pipe.

The wafers were carried by the transport robot from the load-lock chamber via the transport chamber to the process chamber and placed on the susceptor.

6) After the process chamber was set at a pressure of 450 Torr, the wafers transported on the susceptor was heated with an IR lamp at a rate of 100° C./min up to 900° C. and held at this temperature for 2 seconds and then cooled down to 750° C. and taken out again with the transport robot via the transport chamber to the load-lock chamber. Another wafer was held at 900° C. for 120 seconds and then otherwise subjected to the same treatments as described above and then returned to the load-lock chamber.

7) The load-lock chamber was opened to the atmosphere and the wafers were taken out. The porous layer surfaces were measured with a particle-inspecting apparatus to show that the 2 seconds treated wafer has an average Haze value of the porous layer surface of 12.1 and the 60 seconds treated wafer had an average Haze value of the porous layer surface of 14.3. Since the sample had an average Haze value of 9.2 before being placed in the expitaxial growth apparatus, their Haze values were about 1.3 times and 1.6 times as large as those before the treatment, respectively.

8) Further, SOI substrates provided beforehand were dipped into an HF solution, then cleaned with water and dried, and measured for the film thickness of the SOI layer with an optical interference type film thickness meter and subjected to treatments 5) and 6) above and taken out from the load-lock chamber. The thicknesses of the SOI layers were measured again to find that the film thickness reduced only by less than 1 nm in the both samples.

9) The wafers subjected to treatment 4) above were transported to the process chamber of the epitaxial growth apparatus in the manner as mentioned in 5) above.

10) After the pressure of the process chamber was set at 450 Torr, the wafer transported on the susceptor was heated with an IR lamp at a rate of 100° C./min and subjected to heat treatment (pre-bake treatment) to be held at 900° C. for 2 seconds; then $SiH_4$ was added to the hydrogen carrier gas so as to provide a concentration of 28 ppm to thereby treat the wafer for 200 seconds and the addition of $SiH_4$ was stopped. Then the pressure was decreased to 80 Torr and the temperature, down to 900° C., and $SiH_2Cl_2$ was added so as to provide a concentration of 0.7 molt to thereby form a non-porous monocrystalline silicon film in the thickness of 2 $\mu$m. Then, the temperature was decreased to 750° C. in the hydrogen atmosphere and the wafer was again taken out with the transport robot via the transport chamber to the load-lock chamber. The other wafer was subjected to the pre-bake treatment at 900° C. in a hydrogen atmosphere for 60 seconds and otherwise underwent the same treatment as described above and returned to the load-lock chamber.

11) The wafers as finished of treatment 10) above were etched for defect revealing to reveal crystal defects introduced into the non-porous monocrystalline silicon layer and then observed with a Nomarski differential interference microscope. Thus observed defects had a stacking fault percentage of 99% or more. The stacking fault density was 350/cm$^2$ for the 2 seconds pre-bake and 400/cm$^2$ for the 60 seconds pre-bake, thus being reduced drastically as compared to $1.5 \times 10^4$/cm$^2$ for the 120-second pre-bake treatment at 1100° C., so that a defect density less than 1000/cm$^2$ was attained.

EXAMPLE 6

870° C., 80 Torr. Pre-bake (5 Seconds, 60 Seconds), Pre-injection, Epi-2 $\mu$m)

1) Boron was added as a p-type impurity, to provide 6-inch (100) p$^+$ silicon wafers (CZ wafers) with a resistivity of 0.015$\Omega$cm+/−0.005$\Omega$cm.

2) In a solution in which 49% HF and ethyl alcohol were mixed at a ratio of 2:1, the above-mentioned silicon wafer was disposed as the anode and a 6-inch-diameter platinum plate was disposed as the cathode in opposition to the silicon wafer. The back side of the silicon wafer was made in opposition to a surface side of another p$^+$ silicon wafer with the same solution therebetween, thus permitting the most distant wafer to face a 6-inch-diameter platinum plate. The respective solutions between the wafers were separated from each other, thus preventing electrical conduction therebetween. Between the above-mentioned silicon wafer and the platinum plate was passed a current at a current density of 10 mA/cm$^2$ for 12 minutes to anodize the silicon wafers, thus forming a porous silicon layer of 12 $\mu$m thickness on each surface.

3) Subsequently, each wafer on which a porous silicon layer was thus formed was subjected to oxidization at 400° C. in an oxygen atmosphere for 1 hour. Since this oxidation treatment provided only about 50 Å or less thickness of an oxide film, the silicon oxide film was formed only on the porous silicon surface and the pore side walls, leaving a monocrystalline silicon region inside of the wafer.

4) The above-mentioned wafers were dipped in an HF aqueous solution diluted to 1.3% for 30 seconds and then in pure water for 10 minutes for overflow rinsing, to remove the ultra-thin silicon oxide film formed on the porous layer surface.

5) The above-mentioned wafers, as placed on a wafer carrier, were set in a load-lock chamber of the epitaxial CVD growth apparatus in which the load-lock chamber for setting wafers on the wafer carrier, a transport chamber having a wafer transporting robot, and a process chamber were connected. The load-lock chamber was evacuated with a dry pump from the atmospheric pressure down to 1 Torr or less and $N_2$ gas was introduced thereinto to make the pressure 80 Torr. The transport chamber is held at 80 Torr with the introduction of $N_2$ gas beforehand. In the process chamber was placed a susceptor which is made of carbon coated with CVD-SiC for holding wafers. The susceptor was heated to about 750° C. by an IR lamp beforehand. A hydrogen purifier using a heated palladium alloy supplied purified hydrogen gas to the process chamber via an about 10-meter long internally polished stainless steel pipe.

The wafers were carried by the transport robot from the load-lock chamber via the transport chamber to the process chamber and placed on the susceptor.

6) After the process chamber was set at a pressure of 80 Torr, the wafers transported on the susceptor was heated with an IR lamp at a rate of 100° C./min up to 870° C. and held at this temperature for 5 seconds and then cooled down to 750° C. and taken out again with the transport robot via the transport chamber to the load-lock chamber. Another wafer was held at 870° C. for 60 seconds and then otherwise subjected to the same treatments as described above and then returned to the load-lock chamber.

7) The load-lock chamber was opened to the atmosphere and the wafers were taken out. The Haze value was measured with Surfscan 6420 which irradiates an oblique incident of an Ar laser with a wavelength of 488 nm as a particle-inspecting apparatus. As the result, it was found that the 5 seconds treated wafer had an average Haze value of the porous layer surface of 10.2 and the 30 seconds treated wafer had an average Haze value of the porous layer surface of 19.5. Since the sample had an average Haze value of 8.5 before being placed in the expitaxial growth apparatus, their Haze values after the treatment were about 1.2 times and about 2.3, respectively.

8) Further, SOI substrates provided beforehand were dipped into an HF solution, then cleaned with water and dried, and measured for the film thickness of the SOI layer with an optical interference type film thickness meter and subjected to treatments 5) and 6) above and taken out from the load-lock chamber. The thicknesses of the SOI layers were measured again to find that the film thickness reduced only by less than 1 nm in the both samples.

9) The wafers subjected to treatment 4) above were transported to the process chamber of the epitaxial growth apparatus in the manner as mentioned in 5) above.

10) After the pressure of the process chamber was set at 80 Torr, the wafer transported on the susceptor was heated with an IR lamp at a rate of 100° C./min and subjected to heat treatment (pre-bake treatment) to be held at 900° C. for 2 seconds; then $SiH_4$ was added to the hydrogen carrier gas so as to provide a concentration of 35 ppm to thereby treat the wafer for 150 seconds and the addition of $SiH_4$ was stopped. Then, $SiH_2Cl_2$ was added so as to provide a concentration of 1 mol % to thereby form a non-porous monocrystalline silicon film in the thickness of 2 $\mu$m. Then, the temperature was decreased to 750° C. in the hydrogen atmosphere and the wafer was again taken out with the transport robot via the transport chamber to the load-lock chamber. The other wafer was subjected to the pre-bake treatment for 60 seconds and otherwise underwent the same treatment as described above and returned to the load-lock chamber.

11) The wafers as finished of treatment 10) above were etched for defect revealing to reveal crystal defects introduced into the non-porous monocrystalline silicon layer and then observed with a Nomarski differential interference microscope. Thus observed defects had a stacking fault percentage of 99% or more. The stacking fault density was 120/cm$^2$ for the 5 seconds pre-bake and 430/cm$^2$ for the 30 seconds pre-bake, thus being reduced drastically as compared to 1.5×10$^4$/cm$^2$ for the 120-second pre-bake treatment at 1100° C., so that a defect density less than 1000/cm$^2$ was attained.

EXAMPLE 7

950° C., Pre-bake (2 seconds), Pre-injection, Epi-0.32 $\mu$m, Recycle-ELTRAN

1) As a first substrate, 8-inch (100) p+ silicon wafers (CZ wafers) were provided which was obtained by adding boron as a p-type impurity to provide a resistivity of 0.015Ωcm+/−0.01Ωcm.

2) A surface layer of the first monocrystalline silicon substrate was anodized in an HF solution. The first anodizing conditions were as follows:
Current density: 7 mA/cm$^2$
Anodizing solution: HF:H$_2$O:C$_2$H$_5$OH=1:1:1
Time: 5 (min)
Thickness of porous silicon layer: 5 ($\mu$m)
The other conditions were as follows:
Current density: 50 mA/cm$^2$
Anodizing solution: HF:H$_2$O:C$_2$H$_5$OH=1:1:1
Time: 10 (seconds)
Thickness of porous silicon:~0.2 $\mu$m The porosity of the porous silicon layer anodized at a current density of 50 mA/cm$^2$ was increased, thus forming structurally fragile high-porosity thin films. That is, from the surface side of the silicon wafer, a porous layer with a low porosity and a porus layer with a high porosity were formed in this order.

3) Subsequently, each wafer on which a porous silicon layer was formed was subjected to oxidization in an oxygen atmosphere at 400° C. for 1 hour (pre-oxidation). Since this oxidization treatment provided only about 50 Å or less thickness of an oxide film, the silicon oxide film was formed only on the porous silicon surface and the pore side walls, leaving a monocrystalline silicon region inside of the wafer.

4) The above-mentioned wafers were dipped for 30 seconds in an HF aqueous solution diluted to 1.25% and then in pure water for 10 minutes for overflow rinsing, to remove the ultra-thin silicon oxide film formed on the porous layer surface.

5) The above-mentioned wafers were placed on a wafer carrier and set in a load-lock chamber of the expitaxial CVD-growth apparatus in which the load-lock chamber to set wafers on the wafer carrier, a transport chamber having a wafer transport robot, and a process chamber were connected.

The load-lock chamber was evacuated with a dry pump from the atmospheric pressure down to 1 Torr or less, and N$_2$ gas was introduced thereinto to increase the pressure to 80 Torr.

The transport chamber was held at 80 Torr by introducing N$_2$ gas beforehand. In the process chamber was placed a susceptor which is made of carbon coated with CVD-SiC for holding wafers. The susceptor was heated with an IR lamp to about 750° C. beforehand. Into the process chamber was supplied purified hydrogen gas from a hydrogen purifier using a heated palladium alloy via an about 10-meter long internally polished stainless steel pipe.

The wafers were carried with the transport robot from the load-lock chamber via the transport chamber to the process chamber and placed onto the susceptor.

6) The wafers thus transported on the susceptor were heated with an IR lamp at a rate of 100° C./min and held at 950° C. for pre-bake for 2 seconds as the heat treatment (pre-bake treatment); then SiH$_4$ was added to the hydrogen carrier gas so as to provide a concentration of 28 ppm to thereby treat the wafer for 200 seconds and the addition of SiH$_4$ was stopped. Then the temperature was lowered to 900° C., and SiH$_2$Cl$_2$ was added so as to provide a concentration of 0.5 molt to thereby form a non-porous monocrystalline silicon film in the thickness of 0.32 $\mu$m. Then the temperature was lowered to 750° C. in the hydrogen atmosphere and the wafers were taken out again with the transport robot via the transport chamber to the load-lock chamber. The thus formed non-porous monocrystalline silicon layers have an average thickness of 0.32 $\mu$m and the maximum value−the minimum value=8 nm. The Haze value after the heat treatment was 11.4 as compared with the Haze value of 9.5 before the heat treatment. That is, the r value was 1.2.

Further, SOI substrates provided beforehand were dipped into an HF solution, then cleaned with water and dried, and measured for the film thickness of the SOI layer with an optical interference type film thickness meter and subjected to treatments 5) and 6) above and taken out from the load-lock chamber. The thicknesses of the SOI layers were measured again to find that the film thickness reduced only by less than 1 nm in the both samples.

7) Each wafer on which the non-porous monocrystalline silicon layer was expitaxial-grown was set in a vertical type furnace and subjected to heat treatment at 1000° C. in a mixture gas of water vapor formed by burning oxygen and hydrogen and the remaining oxygen to oxidize the surface of the non-porous monocrystalline silicon to thus form a silicon oxide film with a thickness of 208 nm. 8) Each of the above-mentioned wafer and a second silicon wafer were cleaned in the cleaning line of a silicon semiconductor process and then superposed upon each other gently with their primary main surfaces facing each other and pressed at the middle thereof to integrate them. 9) Subsequently, the thus integrated wafers were set in the vertical type furnace and subjected to heat treatment at 1100° C. in an oxygen atmosphere for 1 hour. 10) The thus bonded wafers were sprayed with a water jet on the side surface thereof to generate a crack at the side surface, whereby the bonded wafers were divided at the high-porosity porous layer. The dividing method includes, besides water jetting, pressure application, pulling force application, shearing force application, wedging and other external pressure application methods, application of ultrasonic waves, heating, oxidizing to expand porous silicon from the periphery to apply an internal pressure therein, heating in a pulse fashion to apply a thermal stress, and softening. Any of these methods enabled the division.

11) The second silicon wafer having thereon the thus exposed porous silicon layers was dipped into a mixture solution of HF and aqueous hydrogen peroxide solution to remove all of the porous silicon in about 2 hours, showing on the whole wafer surface the interference color due to the non-porous monocrystalline silicon layer and the thermally oxidized silicon film.

12) The wafers as finished of treatment 11) above were cleaned in a cleaning line generally used in the silicon semiconductor device process and set in a vertical type hydrogen annealing furnace and subjected to heat treatment in a 100%-hydrogen atmosphere at 1100° C. for 4 hours. The hydrogen gas used was purified by a commercially available hydrogen purifier using a palladium alloy connected to the apparatus via an about 7-meter long stainless steel pipe polished internally.

13) Thus, SOI structure wafers were produced in which a 200 nm thick silicon oxide layer and a 200 nm thick monocrystalline silicon layer were stacked on the second silicon wafer.

The monocrystalline silicon layers had an average thickness of 201 nm and difference in height between the maximum value and the minimum value was 8 nm.

4) The wafers as finished of treatment 13) above were subjected to defect revealing etching to remove the monocrystalline silicon layer by the thickness of 130 nm and then dipped into a 49% HF solution for 3 minutes. As a result, the buried oxide film was etched by the HF through the portions of crystal defects remaining in the monocrystalline silicon layer etched by the defect revealing etching, which could be easily determined for the defect density with a Nomarski differential interference microscope. The thus observed defect density was 64/cm$^2$. The stacking faults introduced into the non-porous monocrystalline silicon layer was found to be reduced by the hydrogen annealing. Thus, thin film SOI layers with a uniform film thickness and a defect density less than 100/cm$^2$ were obtained.

EXAMPLE 8

950° C., 80 Torr, Pre-bake (2 seconds), Pre-injection, Epi-0.01 μm, Hetero-epitaxy 1) Four p-type or n-type 6-inch-diameter (100) monocrystalline silicon substrates with a thickness of 615 μm and a resistivity of 0.010Ωcm were anodized in an HF solution diluted with alcohol, thus forming a porous silicon layer on one main surface as a mirror surface of each of the substrates.

2) The anodizing conditions were as follows:
Current density: 7 mA/cm$^2$
Anodizing solution: $HF:H_2O:C_2H_5OH=1:1:1$
Time: 12 minutes
Thickness of porous silicon layer: 10 μm
Porosity: 20%

3) Subsequently, each wafer on which a porous silicon layer was formed was subjected to oxidization in an oxygen atmosphere at 400° C. for 1 hour. Since this oxidization treatment provided only about 50 Å or less thickness of an oxide film, the silicon oxide film was formed only on the porous silicon surface and the pore side walls, leaving a monocrystalline silicon region inside of the wafer.

4) The above-mentioned wafers were dipped for 30seconds in an HF aqueous solution diluted to 1.25% and then in pure water for 10 minutes for overflow rinsing, to remove the ultra-thin silicon oxide film formed on the porous layer surface.

5) The above-mentioned wafers were placed on a wafer carrier and set in a load-lock chamber of the expitaxial CVD-growth apparatus in which the load-lock chamber to set wafers on the wafer carrier, a transport chamber having a wafer transport robot, and a process chamber were connected. The load-lock chamber was evacuated with a dry pump from the atmospheric pressure down to 1 Torr or less, and $N_2$ gas was introduced thereinto to increase the pressure to 80 Torr. The transport chamber was held at 80 Torr by introducing $N_2$ gas beforehand. In the process chamber was placed a susceptor which is made of carbon coated with CVD-SiC for holding wafers. The susceptor was heated with an IR lamp to about 750° C. beforehand. Into the process chamber was supplied purified hydrogen gas from a hydrogen purifier using a heated palladium alloy via an about 10-meter long internally polished stainless steel pipe.

The wafers were carried with the transport robot from the load-lock chamber via the transport chamber to the process chamber and placed onto the susceptor.

6) The wafers thus transported on the susceptor were heated with an IR lamp at a rate of 100° C./min and held at 950° C. for pre-bake for 2 seconds; then $SiH_4$ was added to the hydrogen carrier gas so as to provide a concentration of 28 ppm to thereby treat the wafer for 200 seconds and the addition of $SiH_4$ was stopped. Then the temperature was lowered to 750° C. in the hydrogen atmosphere and the wafers were taken out again with the transport robot via the transport chamber to the load-lock chamber. The thus formed non-porous monocrystalline silicon layers have an average thickness of 0.03 μm. The Haze value after the heat treatment was 11.2 as compared with the Haze value of 8.5 before the heat treatment.

By the MOCVD (Metal Organic Chemical Vapor Deposition) method, monocrystalline GaAs was epitaxially grown in the thickness of 1 μm on this porous silicon. The growth conditions were as follows:

Source gas: TMG/AsH$_3$/H$_2$
Gas pressure: 80 Torr
Temperature: 700° C.

As a result of cross-sectional observation by use of a transmission type electron microscope, it was confirmed that no crystal defect was introduced into the GaAs layer and a GaAs layer with good crystallinity was formed. At the same time, it was also confirmed that an extremely abrupt interface was formed between the GaAs layer and the porous silicon layer sealed with silicon on its surface.

Further, defect revealing etching was performed and the thus revealed crystal defects were counted by use of an optical microscope to determined the crystal defect density, which was about $1 \times 10^4$/cm$^2$.

As described above, according to the present invention, the conditions of the heat treatment (pre-bake) to be executed before growth of a non-porous monocrystalline layer on a porous silicon layer can be determined by utilizing the rate of change r for the Haze value which is simply and easily measured.

As described above, according to the present invention, by executing the heat treatment (pre-bake) under the condition of controlling the rate of change r for the Haze value of the surface of porous silicon before and after the heat treatment within 3.5 times, more preferably 2 times as large as that before the heat treatment and under the condition of controlling the etched thickness of silicon within 2 nm or less, more preferably 1 nm or less, the stacking fault density of a non-porous monocrystalline silicon layer formed on a porous layer could be made smaller than 1000/cm$^2$, further about 100/cm$^2$. The effect of the present invention of decreasing crystal defects could be further improved by supplying a slight amount of a silicon raw material to a growth surface at an initial growth stage of non-porous monocrystalline silicon.

From the above result, by applying the present invention to a bonding method, it is possible to obtain an SOI layer with an uniform thickness and remarkably less crystal defect.

In other words, according to the present invention, by controlling the amount of a native oxide film formed on a porous surface in an epitaxial growth apparatus, it is possible to decrease a heat treatment time for removal of the native oxide film and lower a heat treatment temperature for removal of the native oxide film. At the same time, according to the present invention, the structural change on and near the surface of a porous layer can be controlled to form an epitaxial layer having a crystal defect density of smaller than 1000/cm$^2$ before clearly generating modification of the surface structure of the porous layer.

What is claimed is:

1. A method of producing a semiconductor substrate comprising a non-porous monocrystalline layer on a porous silicon layer, which comprises, before a step of forming the non-porous monocrystalline layer on the porous silicon layer, a step of heat-treating the porous silicon layer in an atmosphere not containing a source gas of the non-porous monocrystalline layer, such that the etched thickness of silicon due to the heat treatment is not more than 2 nm and that a rate of change r for Haze values of the porous silicon layer surface before and after the heat treatment defined by (the Haze value of the porous silicon layer surface after the heat treatment)/(the Haze value of the porous silicon layer surface before the heat treatment) is in a range wherein $1 \leq r \leq 3.5$.

2. A method of producing a semiconductor substrate, which comprises a step of providing a substrate comprising a porous silicon layer, a heat treatment step of heat-treating the porous silicon layer, and a growth step of growing a non-porous monocrystalline layer on the porous silicon layer, wherein the heat treatment step is conducted in an atmosphere not containing a source gas of the non-porous monocrystalline layer such that the etched thickness of silicon due to the heat treatment is not more than 2 nm and that the rate of change r for the Haze value of the porous silicon layer surface defined by (the Haze value after the heat treatment)/(the Haze value before the heat treatment) satisfies the relationship of $1 \leq r \leq 3.5$.

3. A method of producing a semiconductor substrate, which comprises a step of providing a first substrate comprising a porous silicon layer, a heat treatment step of heat-treating the porous silicon layer, a growth step of growing a non-porous monocrystalline layer on the porous silicon layer, and a step of transferring the non-porous monocrystalline layer grown on the first substrate onto a second substrate, wherein the heat treatment step is conducted in an atmosphere not containing a source gas of the non-porous monocrystalline layer such that the etched thickness of silicon due to the heat treatment is not more than 2 nm and that the rate of change r for the Haze value of the porous silicon layer surface defined by (the Haze value after the heat treatment)/(the Haze value before the heat treatment) satisfies the relationship of $1 \leq r \leq 3.5$.

4. The method of producing a semiconductor substrate according to claim 2 or 3, wherein the growth of the non-porous monocrystalline layer is carried out at a growth rate of 20 nm/min or less.

5. The method of producing a semiconductor substrate according to claim 2 or 3, wherein the growth of the non-porous monocrystalline layer is carried out at a growth rate of 10 nm/min or less.

6. The method of producing a semiconductor substrate according to claim 2 or 3, wherein the growth of the non-porous monocrystalline layer is carried out at a growth rate of 2 nm/min or less.

7. The method of producing a semiconductor substrate according claim 1, 2 or 3, wherein the rate of change r is $1 \leq r \leq 2$.

8. The method of producing a semiconductor substrate according to claim 2 or 3, wherein the etched thickness is 1 nm or less.

9. The method of producing a semiconductor substrate according to claim 1, 2 or 3, wherein the non-porous monocrystalline layer is a non-porous monocrystalline silicon layer.

10. The method of producing a semiconductor substrate according to claim 1, 2 or 3, wherein the non-porous monocrystalline layer is of SiGe, SiC., or a compound semiconductor.

11. The method of producing a semiconductor substrate according to claim 3, wherein the step of transferring the non-porous monocrystalline layer onto the second substrate comprises the steps of:

bonding the first substrate and the second substrate to each other such that the non-porous monocrystalline layer is positioned inside; and removing the porous silicon layer.

12. The method of producing a semiconductor substrate according to claim 3, wherein the step of transferring the non-porous monocrystalline layer onto the second substrate comprises the steps of:

bonding the first substrate and the second substrate to each other such that the non-porous monocrystalline layer is positioned inside; and dividing the bonded member at the porous silicon layer.

13. The method of producing a semiconductor substrate according to claim 3, wherein the step of transferring the non-porous monocrystalline layer onto the second substrate comprises the step of bonding the first substrate and the second substrate to each other with an insulating layer therebetween.

14. The method of producing a semiconductor substrate according claim 13, wherein the insulating layer is formed on at least one of the non-porous monocrystalline layer and the second substrate.

15. The method of producing a semiconductor substrate according to claim 3, wherein the second substrate is a monocrystalline silicon substrate.

16. The method of producing a semiconductor substrate according to claim 3, wherein the second substrate is a quartz wafer.

17. The method of producing a semiconductor substrate according to claim 1, 2 or 3, wherein the heat treatment step comprises the steps of increasing temperature and removing a native oxide film, and wherein the native oxide film removal step is conducted at a temperature not lower than 850° C. and not higher than 1000° C.

18. The method of producing a semiconductor substrate according to claim 1, 2 or 3, wherein the heat treatment step comprises the steps of increasing temperature and removing a native oxide film, and wherein the native oxide film removal step is conducted in a treatment time of 200 seconds or less.

19. The method of producing a semiconductor substrate according to claim 1, 2 or 3, further comprising, prior to the heat treatment step, the step of forming a protective film on the pore walls of the porous silicon layer.

20. The method of producing a semiconductor substrate according to claim 1, 2 or 3, further comprising, prior to the heat treatment step, the step of removing an oxide film formed on a surface of the porous silicon layer.

21. The method of producing a semiconductor substrate according to claim 1, 2 or 3, wherein the growth step is conducted at a first growth rate and then conducted at a second growth rate larger than the first growth rate.

22. The method of producing a semiconductor substrate according to claim 1, 2 or 3, wherein the heat treatment step and the growth step are conducted in a reaction vessel equipped with a load-lock chamber.

23. The method of producing a semiconductor substrate according to claim 1, 2 or 3, wherein the heat treatment step is conducted at a pressure higher than the pressure at which the growth step is conducted.

24. The method of producing a semiconductor substrate according to claim 1, 2 or 3, wherein the porous silicon layer is obtained by anodizing at least a part of non-porous monocrystalline silicon.

25. The method of producing a semiconductor substrate according to claim 24, where the anodization is carried out using a solution containing hydrofluoric acid, water, and alcohol.

26. The method of producing a semiconductor substrate according to claim 1, 2 or 3, wherein the substrate comprising the porous silicon layer is doped with an impurity at a degenerated level.

27. The method of producing a semiconductor substrate according to claim 1, 2 or 3, wherein the heat treatment step is conducted in a non-oxidizing atmosphere containing hydrogen.

28. The method of producing a semiconductor substrate according to claim 1, 2 or 3, wherein the heat treatment step is conducted in a reducing atmosphere containing hydrogen gas, a nitrogen gas atmosphere, or an inert gas atmosphere.

29. The method of producing a semiconductor substrate according to claim 1, 2 or 3, wherein the heat treatment step is conducted in an ultra-high vacuum.

30. The method of producing a semiconductor substrate according to claim 1, 2 or 3, wherein the heat treatment step is conducted at a temperature not lower than 870° C. and not higher than 970° C.

31. The method of producing a semiconductor substrate according to claim 1, 2 or 3, wherein the heat treatment step comprises removing an oxide on a surface of the porous silicon layer.

32. The method of producing a semiconductor substrate according to claim 21, wherein the growth step executed at the first growth rate is continued until a Haze value after completing a first growth step starts to decrease.

33. The method of producing a semiconductor substrate according to claim 1, wherein the measurement of the Haze value is executed by a method of a surface of a porous silicon layer is irradiated with a laser light and measuring a scattered light intensity, the laser light having a wavelength of 5000 nm or less.

34. A semiconductor substrate obtained by the method according to claim 1, 2 or 3.

35. A method of forming an integrated circuit comprising the steps of:

forming a semiconductor substrate comprising a non-porous monocrystalline layer on a porous silicon layer by heat-treating the porous silicon layer in an atmosphere not containing a source gas of the non-porous monocrystalline layer and forming the non-porous monocrystalline layer on the porous silicon layer, such that the etched thickness of silicon due to the heat treatment is not more than 2 nm and that a rate of change r for Haze values of the porous silicon layer surface before and after the heat treatment defined by (the Haze value of the porous silicon layer surface after the heat treatment)/(the Haze value of the porous silicon layer surface before the heat treatment) is in a range wherein $1 \leq r \leq 3.5$; and forming an integrated circuit using the semiconductor substrate.

36. A method of evaluating a semiconductor substrate, comprising the steps of:

providing a substrate having a porous layer on a surface thereof;

measuring a first Haze value of a surface of the porous layer;

heat-treating the substrate in an atmosphere not containing a source gas for growth of a non-porous layer; and after the heat-treating step, measuring a second Haze value of a surface of the porous layer.

37. The method according to claim 36; wherein a condition of the heat-treating is determined on the basis of the first and second Haze values.

38. The method according to claim 36, wherein a condition of the heat-treating is determined so that a value of (the second Haze value)/(the first Haze value) is not smaller than 1 and not larger than 3.5.

* * * * *

UNITED STATES PATENT AND TRADEMARK OFFICE
CERTIFICATE OF CORRECTION

PATENT NO.   : 6,335,269 B1
DATED        : January 1, 2002
INVENTOR(S)  : Sato

It is certified that error appears in the above-identified patent and that said Letters Patent is hereby corrected as shown below:

<u>Title page,</u>
Item [56], References Cited, OTHER PUBLICATIONS, N. Sato, et al., "layers" should read -- Layers --.

<u>Column 7,</u>
Line 6, "i.e." should read -- i.e., --.

<u>Column 8,</u>
Line 13, "depending" should read -- depending on --.

<u>Column 13,</u>
Line 52, "speedy" should read -- speedily --; and
Line 58, "Off" should read -- Of --.

<u>Column 14,</u>
Line 39, "Into" should read -- into --.

<u>Column 15,</u>
Line 4, "Step The" should read -- Step ¶The --; and
Line 11, "etc," should read -- etc., --

<u>Column 20,</u>
Line 32, "Jet" should read -- jet --.

<u>Column 21,</u>
Line 58, "b e" should read -- be --.

<u>Column 23,</u>
Line 4, "results" should read -- result --.

<u>Column 25,</u>
Line 10, "$\mu$m)" should read -- $\mu$m --.

<u>Column 28,</u>
Line 9, "above. 10)" should read -- above.¶10) --;
Line 13, "w as" should read -- was --; and
Line 14, "decrease d" should read -- decreased --.

UNITED STATES PATENT AND TRADEMARK OFFICE
CERTIFICATE OF CORRECTION

PATENT NO.    : 6,335,269 B1
DATED         : January 1, 2002
INVENTOR(S)   : Sato It is certified that error appears in the above-identified patent and that said Letters Patent is hereby corrected as shown below:

Column 29,
Line 59, "0.7 molt" should read -- 0.7 mol% --.

Column 32,
Line 56, "0.5 molt" should read -- 0.5 mol% --.

Column 33,
Line 13, "208 nm. 8)" should read -- 208 nm.¶8) --;
Line 18, "them. 9) Sebsequently," should read -- them. ¶9) Subsequently, --; and
Line 21, "1 hour. 10) The" should read -- 1hour. ¶ 10) The --.

Column 34,
Line 27, "30sec-" should read -- 30 sec- --.

Column 38,
Line 57, "claim 36;" should read -- claim 36, --.

Signed and Sealed this

Eleventh Day of March, 2003

JAMES E. ROGAN
*Director of the United States Patent and Trademark Office*